United States Patent
Cho et al.

(10) Patent No.: US 9,905,285 B2
(45) Date of Patent: Feb. 27, 2018

(54) DYNAMIC RANDOM ACCESS MEMORY DEVICE AND OPERATING METHOD WITH IMPROVED RELIABILITY AND REDUCED COST

(71) Applicant: Samsung Electronics Co., Ltd., Suwon-si, Gyeonggi-do (KR)

(72) Inventors: Youngjin Cho, Seoul (KR); Jaegeun Park, Suwon-si (KR); Youngkwang Yoo, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/249,333

(22) Filed: Aug. 26, 2016

(65) Prior Publication Data

US 2017/0062040 A1 Mar. 2, 2017

(30) Foreign Application Priority Data

Aug. 27, 2015 (KR) .................. 10-2015-0120919

(51) Int. Cl.
*G11C 7/00* (2006.01)
*G06F 9/00* (2006.01)
*G11C 11/4074* (2006.01)
*G11C 11/406* (2006.01)
*G06F 1/32* (2006.01)

(52) U.S. Cl.
CPC ........ *G11C 11/4074* (2013.01); *G06F 1/3287* (2013.01); *G11C 11/40615* (2013.01); *G11C 11/40626* (2013.01); *G11C 2211/4067* (2013.01)

(58) Field of Classification Search
None
See application file for complete search history.

(56) References Cited

U.S. PATENT DOCUMENTS

| | | | |
|---|---|---|---|
| 5,717,644 A | 2/1998 | Hadderman et al. | |
| 5,968,173 A * | 10/1999 | Watts, Jr. | G06F 9/4401 713/2 |
| 6,088,762 A | 7/2000 | Creta | |
| 6,311,250 B1 | 10/2001 | Kishino | |
| 6,603,697 B2 | 8/2003 | Janzen | |
| 6,757,207 B1 | 6/2004 | Lazar | |
| 7,679,133 B2 | 3/2010 | Son et al. | |
| 7,760,572 B2 | 7/2010 | Koshita | |

(Continued)

*Primary Examiner* — Harry W Byrne
*Assistant Examiner* — Sultana Begum
(74) *Attorney, Agent, or Firm* — Renaissance IP Law Group LLP

(57) ABSTRACT

A dynamic random access memory (DRAM) device includes a memory cell array including a plurality of memory cells, a refresh controller configured to perform a plurality of refresh operations on the plurality of memory cells in response to a plurality of refresh commands from an external device, and a refresh counter configured to count a number of the refresh commands for a fixed period of time and compare the counted number with a threshold. The refresh counter is configured to generate a power failure signal to cause the DRAM device to enter a power failure mode in response to the comparison of the counted number with the threshold. The refresh controller is configured to perform a refresh operation on the plurality of memory cells without control of the external device in the power failure mode.

20 Claims, 18 Drawing Sheets

(56) References Cited

U.S. PATENT DOCUMENTS

| | | |
|---|---|---|
| 8,200,885 B2 | 6/2012 | Sartore |
| 8,553,466 B2 | 10/2013 | Han et al. |
| 8,559,235 B2 | 10/2013 | Yoon et al. |
| 8,654,587 B2 | 2/2014 | Yoon et al. |
| 9,665,437 B2* | 5/2017 | Bhargava ............ G06F 11/1451 |
| 2003/0067827 A1 | 4/2003 | Janzen |
| 2006/0136765 A1 | 6/2006 | Poisner et al. |
| 2008/0181041 A1 | 7/2008 | Koshita |
| 2009/0046531 A1* | 2/2009 | Noh ...................... G11C 11/406 |
| | | 365/222 |
| 2009/0121271 A1 | 5/2009 | Son et al. |
| 2009/0235038 A1 | 9/2009 | Sartore |
| 2011/0216603 A1 | 9/2011 | Han et al. |
| 2011/0233648 A1 | 9/2011 | Seol et al. |
| 2012/0033519 A1* | 2/2012 | Confalonieri ...... G11C 13/0004 |
| | | 365/222 |
| 2012/0051143 A1 | 3/2012 | Yoon et al. |
| 2013/0279262 A1 | 10/2013 | Yoon et al. |
| 2014/0029367 A1* | 1/2014 | Jung ................ G11C 11/40615 |
| | | 365/222 |
| 2014/0254298 A1* | 9/2014 | Dally .................... G11C 11/406 |
| | | 365/222 |
| 2015/0081958 A1* | 3/2015 | Li ........................... G06F 1/30 |
| | | 711/103 |
| 2016/0344834 A1* | 11/2016 | Das .................... H04L 67/1097 |

\* cited by examiner

DYNAMIC RANDOM ACCESS MEMORY DEVICE AND OPERATING METHOD WITH IMPROVED RELIABILITY AND REDUCED COST

CROSS-REFERENCE TO RELATED APPLICATIONS

A claim for priority under 35 U.S.C. § 119 is made to Korean Patent Application No. 10-2015-0120919, filed on Aug. 27, 2015, in the Korean Intellectual Property Office, the entire contents of which are hereby incorporated by reference.

BACKGROUND

Semiconductor memory devices are typically implemented using semiconductors such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Volatile memory devices include static RAM (SRAM), dynamic RAM (DRAM), synchronous DRAM (SDRAM), and the like. Nonvolatile memory devices retain their stored data even when their power supplies are interrupted. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

Due to high access speeds, DRAMs have been widely adopted in the marketplace, and can be used, for example, as a working memory, a buffer memory, and a main memory of a computing system. At a fundamental level, a memory cell of a DRAM includes a transistor and a capacitor. A DRAM stores data by charging or discharging electric charges to or from the capacitor. But the charge in the capacitor leaks out over time. Accordingly, the DRAM periodically performs a refresh operation to retain the data stored in the DRAM. When the refresh operation is not performed sufficiently, the stored data may be lost.

SUMMARY

The present disclosure relates to a dynamic random access memory (DRAM) device with improved reliability and reduced cost, an operating method of the DRAM device, and a memory module including the DRAM device.

A dynamic random access memory (DRAM) device according to example embodiments of inventive concepts includes a memory cell array including a plurality of memory cells, a refresh controller configured to perform a plurality of refresh operations on the plurality of memory cells in response to a plurality of refresh commands from an external device, and a refresh counter configured to count a number of the refresh commands for a fixed period of time and compare the counted number with a threshold. The refresh counter may be configured to generate a power failure signal to cause the DRAM device to enter a power failure mode in response to the comparison of the counted number with the threshold. The refresh controller may be configured to perform a refresh operation on the plurality of memory cells without control of the external device in the power failure mode.

A memory module according to example embodiments of inventive concepts includes a nonvolatile memory device, a dynamic random access memory (DRAM) device, and a control device configured to control the DRAM. The DRAM device may be configured to count a number of refresh commands received from the control device, to compare the counted number with a threshold, and to output a power failure signal in response to the comparison. The control device may be configured to control the DRAM device such that data stored in the DRAM device is backed up to the nonvolatile memory device in response to the power failure signal.

An operating method of a dynamic random access memory (DRAM) device including a plurality of memory cells according to example embodiments of inventive concepts includes counting a refresh command for fixed time, comparing the counted value with a threshold, and entering a power failure mode according to a comparison result. In the power failure mode, the DRAM device may perform a refresh operation without control of an external device.

A memory module according to example embodiments of inventive concepts includes a memory cell array including a plurality of memory cells, a nonvolatile memory, a refresh controller configured to perform a plurality of refresh operations on the plurality of memory cells in response to a plurality of refresh commands, a refresh counter configured to count a number of the refresh commands for a fixed period of time, and compare the counted number with a threshold, and a nonvolatile memory controller configured to back up data stored in the plurality of memory cells to the nonvolatile memory in response to the comparison.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. In the drawings.

DETAILED DESCRIPTION

Figure 1:
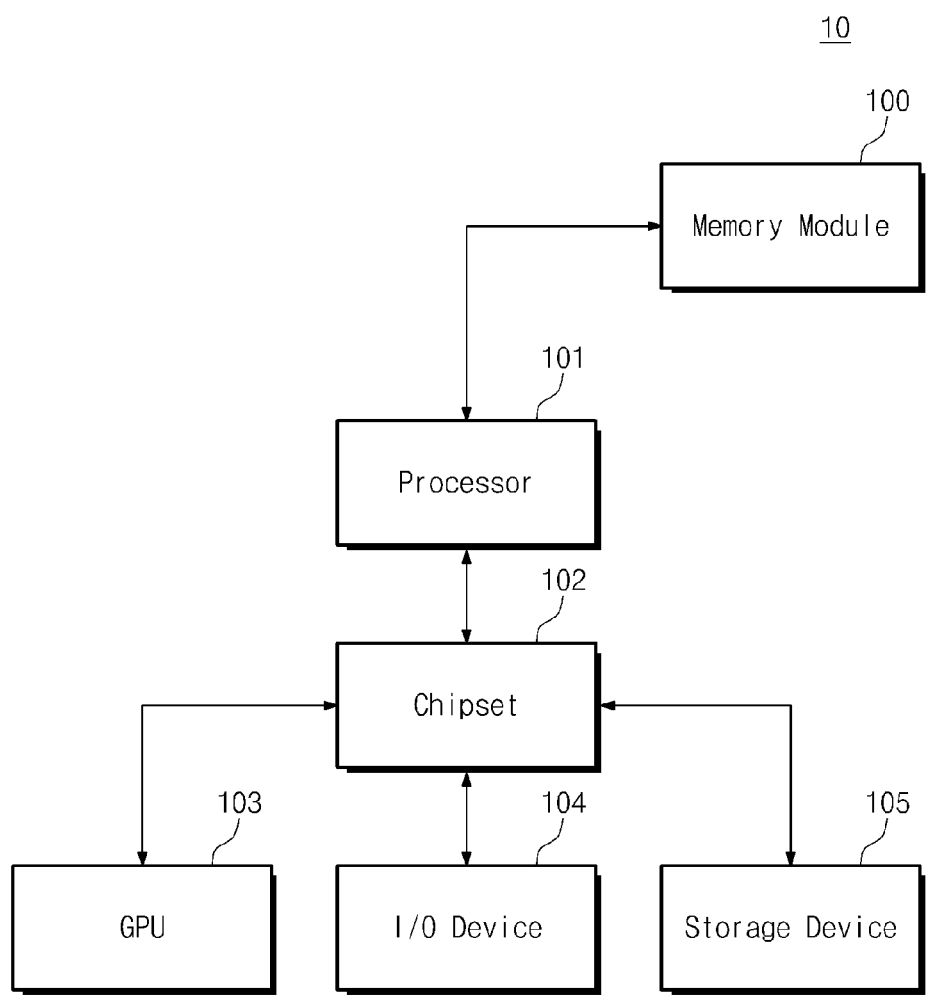
FIG. 1 is a block diagram of a user system according to example embodiments of inventive concepts.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

A DRAM device according to example embodiments of inventive concepts may count a refresh command for a predetermined time, and compare the counted number with a threshold to determine a condition indicating a lack of sufficient refresh condition. When a result of that determination indicates the lack of sufficient refresh condition, the DRAM device may enter a power failure mode. The DRAM device may perform a refresh operation in the power failure mode. In addition, a memory module including the DRAM device may back up data stored in the DRAM device to a nonvolatile memory device in the power failure mode. Thus, a DRAM having improved reliability is provided. In addition, an operating method of the DRAM having the improved reliability and a memory module including the DRAM are also provided.

FIG. 1 is a block diagram of a user system 10 according to example embodiments of inventive concepts. Referring to FIG. 1, the user system 10 includes a memory module 100, a processor 101, a chipset 102, a graphic processing unit (GPU) 103, an input/output (I/O) device 104, and a storage device 105.

The user system 10 may include an electronic device such as a computer, a handheld computer, an ultra mobile PC (UMPC), a workstation, a server computer, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting/receiving information in wireless environment, or one of various electronic devices constituting a home network.

The memory module 100 may be directly connected to the processor 101 to operate under the control of the processor 101. The memory module 100 may be in the form of a dual in-line memory module (DIMM) and may be mounted on a DIMM socket directly connected to the processor 101 to communicate with the processor 101. The processor 101 may control the overall operation of the user system 10. The processor 101 may perform various operations performed in the user system 10.

The chipset 102 may be electrically connected to the processor 101, and may control hardware of the user system 10 under the control of the processor 101. For example, the chipset 102 may be connected to the GPU 103, the I/O device 104, or the storage device 105 through main buses, respectively and serve as a bridge for the main buses. The GPU 103 may perform a series of operations to output image data of the user system 10. In some example embodiments, the GPU 103 may be mounted in a processor 101 in the form of a system-on-chip (SoC).

The I/O device 104 includes various devices that input data or a command to the user system 10, or outputs data to a device or entity that is external relative to the user system 10. For example, the I/O device 104 may include user input devices such as a keyboard, a keypad, a button, a touch panel, a touch screen, a touch ball, a touch pad, a camera, a gyroscope sensor, a vibration sensor, a piezoelectric element, a temperature sensor, and/or a biometric sensor. In addition, the I/O device 104 may include user output devices such as a liquid crystal display (LCD), an organic light emitting diode (OLED) display, an active matrix OLED (AMOLED) display, an LED, a speaker, and a motor.

The storage device 105 may be used as a mass storage medium of the user system 10. The storage device 105 may include mass storage media such as a hard disk drive (HDD), a solid state drive (SSD), a memory card, a memory stick, or the like.

In some example embodiments, the memory module 100 may be implemented with various memory devices including a volatile memory such as DRAM, SRAM and SDRAM, or the like, or a nonvolatile memory such as read only memory (ROM), programmable ROM (PROM), electrically programmable ROM (EEPROM), flash memory, phase-change RAM (PRAM), magnetic RAM (MRAM), resistive RAM (RRAM), ferroelectric RAM (FRAM), or the like.

In some example embodiments, the memory module 100 may include a DRAM device and a nonvolatile memory device. That is, the memory module 100 may be a nonvolatile memory module. The processor 101 may write data into the DRAM device or output data written into the DRAM device.

As mentioned above, a DRAM device needs to periodically perform a refresh operation to retain stored data. The processor 101 may transmit a refresh command to the memory module 100 according to predetermined timing. The DRAM device of the memory module 100 may perform a refresh operation in response to a refresh command from the processor 101.

When a refresh operation is not performed in a DRAM device for a specific time, data in the DRAM device may be lost. A DRAM device according to example embodiments of inventive concepts may count a refresh command for a predetermined time, and compare the counted number with a threshold to enter a power failure mode. For example, if the counted number is smaller than the threshold, then the DRAM device may enter the power failure mode. The DRAM device entering the power failure mode may perform a refresh operation. Alternatively or in addition, data stored in the DRAM device may be backed up to a nonvolatile memory device. In other words, a nonvolatile memory controller may back up data stored in memory cells of the DRAM device to the nonvolatile memory in response to the counted number being less than the threshold.

Hereinafter, a DRAM device according to some example embodiments of the inventive concepts, and a memory module including the DRAM device, are described in detail below with reference to the accompanying drawings.

Figure 2:
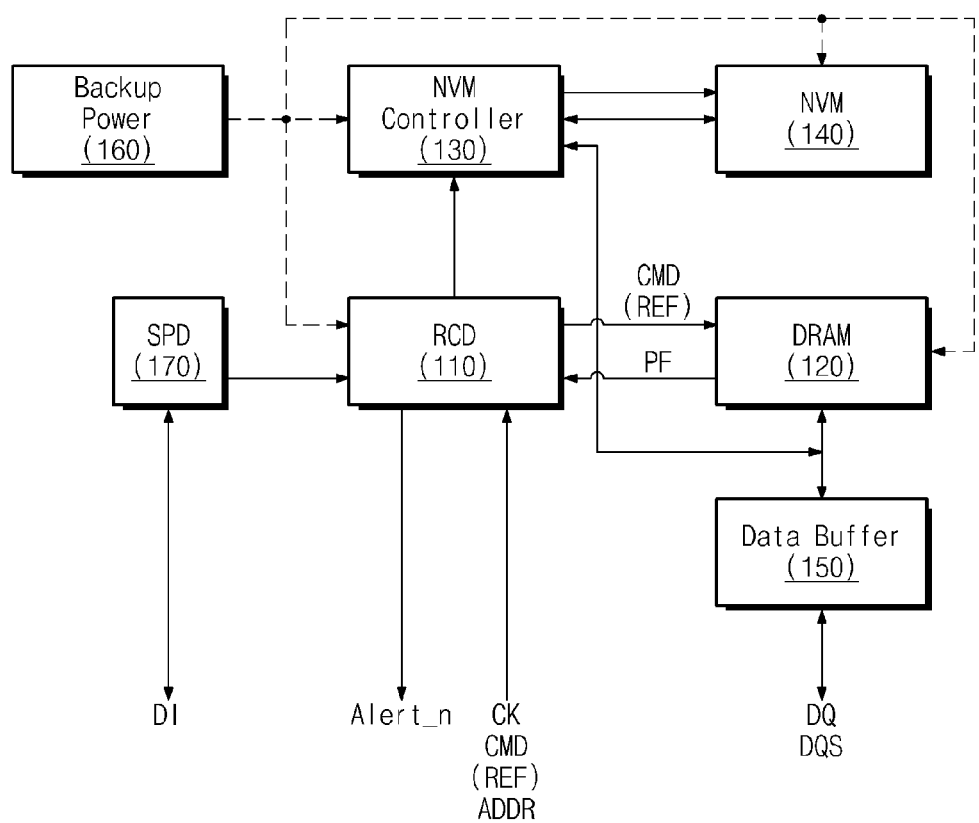
FIG. 2 is a block diagram of a memory module of FIG. 1.

FIG. 2 is a block diagram of the memory module 100 of FIG. 1. Referring to FIGS. 1 and 2, the memory module 100 includes a RAM control device 110, a DRAM device 120, a nonvolatile memory (NVM) controller 130, a nonvolatile memory device 140, a data buffer 150, a backup power unit 160, and a serial presence detect chip (SPD) 170.

In some example embodiments, the memory module 100 may be in the form of a load-reduced dual in-line memory module (LRDIMM), and may be mounted on a DIMM socket electrically connected to the processor 101 to communicate with the processor 101. In some example embodiments, the RAM control device 110 may be a Register Clock Driver (RCD). Hereinafter, the RAM control device 110 will be referred to as RCD 110.

The RCD 110 may receive a clock CK, a command CMD, and/or an address ADDR from the processor 101. The RCD 110 may control the DRAM device 120 in response to signals received from the processor 101. The DRAM device 120 may write data, or output written data, under the control of the RCD 110. For example, the DRAM device 120 may receive a command CMD from the RCD 110. In response to the received command CMD, the DRAM device 120 may receive data DATA through a data signal DQ pin and a data strobe signal through a DQS pin. It will be understood that the term "pin" may refer to a physical terminal, a conductive line, or the like. Alternatively or in addition, in response to the received command CMD, the DRAM device 120 may provide written data to the data buffer 150, and through the data signal DQ pin and/or through the data strobe signal DQS pin.

The NVM controller 130 may control the nonvolatile memory device 140 under the control of the RCD 110. For example, the NVM controller 130 may read data stored in the nonvolatile memory device 140, or program data into the nonvolatile memory device 140, under the control of the RCD 110. In some example embodiments, data to be programmed into the nonvolatile memory device 140 may be provided to the data buffer 150. In some example embodiments, data read from the nonvolatile memory device 140 may be provided to the data buffer 150.

In some example embodiments, when the processor 101 accesses the nonvolatile memory device 140, the RCD 110 may provide the received command CMD and an address ADDR to the NVM controller 130. The nonvolatile memory device 140 may output stored data, or program received data, under the control of the NVM controller 130. In some example embodiments, the nonvolatile memory device 140 may include nonvolatile memory devices such as read only memory (ROM), programmable ROM (PROM), electrically programmable ROM (EPROM), electrically erasable and programmable ROM (EEPROM), NAND flash memory, phase-change RAM (PRAM), magnetic RAM (MRAM), resistive RAM (RRAM), ferroelectric RAM (FRAM), or the like.

The backup power unit 160 may supply auxiliary power to the memory module 100. For example, data stored in the DRAM device 120 may be backed up to the nonvolatile memory device 140 by a request of the processor 101, or in response to a power failure state such as a sudden power-off (SPO). In such a scenario, the backup power unit 160 may supply the auxiliary power to the RCD 110, the DRAM device 120, the NVM controller 130, and the nonvolatile memory device 140, to perform a backup operation.

The serial presence detect chip (SPD) 170 may be an electrically erasable and programmable ROM (EEPROM). The SPD 170 may include device information DI and/or initial information of the memory module 100. In some example embodiments, the initial information may include a module form, a module configuration, storage capacity, a module type, an execution environment of the memory module 100, or the like. When the user system 10 including the memory module 100 is booted, the processor 101 may read the device information DI from the SPD 170 and recognize the memory module 100 based on the read device information DI. The processor 101 may control the memory module 100 based on the device information DI from the SPD 170.

In some example embodiments, the SPD 170 may communicate with the processor 101 through a serial bus. The processor 101 may exchange a signal with the SPD 170 through the serial bus. In some example embodiments, the SPD 170 may communicate with the RCD 110 through a serial bus. In some example embodiments, a serial bus may include one or more two-line serial buses such as I2C, SMBus, PMBus, IPMI, MCTP, or the like.

In some example embodiments, the DRAM device 120 may perform a refresh operation under the control of the RCD 110. For example, the RCD 110 may receive a refresh command REF from the processor 101. The RCD 110 may transmit the refresh command REF received from the processor 101 to the DRAM device 120. The DRAM device 120 may perform the refresh operation in response to the refresh command REF.

As described above, the DRAM device 120 may count the refresh command REF for a predetermined period of time and compare the counted number with a threshold to detect the lack of sufficient refresh condition. For example, when the number of counted refresh commands RED is smaller than the threshold, a determination may be made that there is a lack of sufficient refresh occurring. In this case, the DRAM device 120 may enter a power failure mode and provide a power failure signal PF to the RCD 110. The RCD 110 may alert the processor 101 as to the lack of sufficient refresh or a power failure state in response to the power failure signal PF. In some example embodiments, the RCD 110 may alert the processor 101 of the power failure state through an alert signal (e.g., Alert_n).

In some example embodiments, the processor 101 may recognize the power failure state in response to the alert signal Alert_n and control the backup operation of the memory module 100. Alternatively, the RCD 110 and the NVM controller 130 may perform the backup operation without control of the processor 101. For example, the NVM controller 130 may back up data stored in memory cells of the DRAM device 120 to the nonvolatile memory 140 in response to the counted number being less than the threshold.

When the DRAM device 120 enters the power failure mode, the DRAM device 120 may perform a refresh operation periodically or non-periodically. Moreover, in the power failure mode, the DRAM device 120 may perform a refresh operation on all memory cells or some memory cells.

Figure 3:
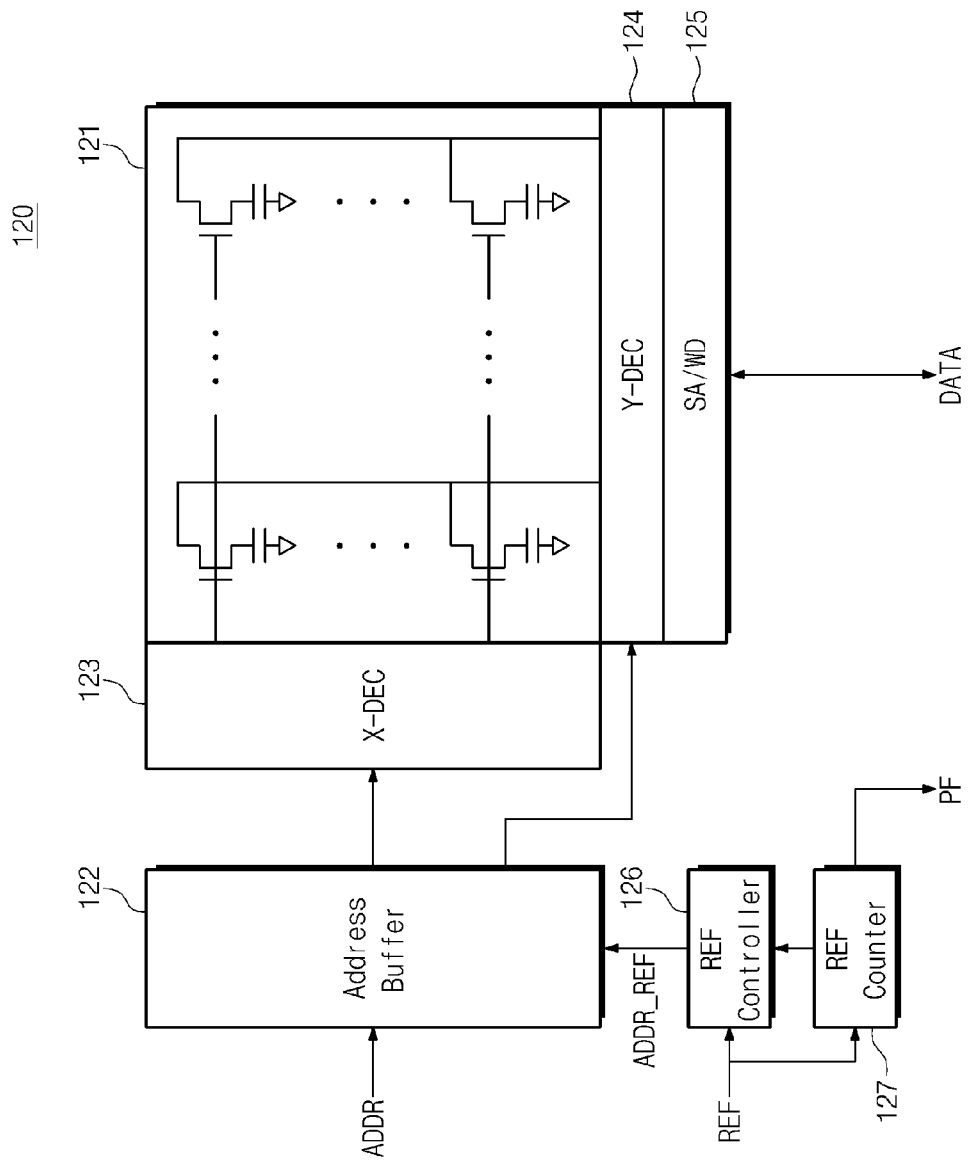
FIG. 3 is a block diagram of a DRAM device of FIG. 2.

FIG. 3 is a block diagram of the DRAM device 120 of FIG. 2. Referring to FIGS. 2 and 3, the DRAM device 120 includes a memory cell array 121, an address buffer 122, an X-decoder 123, a Y-decoder 124, a sense amplifier and write driver (SA/WD) 125, a refresh controller 126, and a refresh counter 127.

The memory cell array 121 includes a plurality of memory cells. Each of the memory cells is connected to a plurality of wordlines and a plurality of bitlines. Each of the memory cells includes a transistor and a capacitor.

The address buffer 122 may receive an address ADDR from the RCD 110 and transmit the received address ADDR to the X-decoder 123 and the Y-decoder 124. In some example embodiments, the address buffer 122 may transmit a row address to the X-decoder 123 and transmit a column address to the Y-decoder 124.

The X-decoder 123 is connected to the memory cell array 121 through a plurality of wordlines. The X-decoder 123 may select at least one of the wordlines based on the row address from the address buffer 122 and activate the selected wordline. The Y-decoder 124 is connected to the memory cell array 121 through a plurality of bitlines. The Y-decoder 124 may control the bitlines based on the column address from the address buffer 122.

The sense amplifier and write driver 125 is connected to a plurality of bitlines included in the memory cell array 121. The sense amplifier and write driver 125 senses voltage variation of an activated one of the bitlines, amplifies the sensed voltage variation, and outputs the amplified voltage variation. Alternatively, the sense amplifier and write driver 125 may control an activated one of the bitlines based on data received from an external device (e.g., processor 101).

The refresh controller 126 may perform a refresh operation in response to the refresh command REF from the RCD 110. For example, the refresh controller 126 may generate a refresh address ADDR_REF in response to the refresh command REF. The refresh address ADDR_REF may be generated in a predetermined order. Alternatively, the refresh address ADDR_REF may be generated according to a certain rule.

During the refresh operation of the DRAM device 120, data is read from memory cells corresponding to the refresh address ADDR_REF, and the read data may be rewritten into the memory cells corresponding to the refresh address ADDR_REF. That is, the memory cells corresponding to the refresh address ADDR_REF are recharged based on the read data. The refresh operation may be performed to retain the data stored in the DRAM device 120.

The refresh counter 127 may count the number of refresh commands REF received from the RCD 110 to detect the lack of sufficient refresh condition. For example, the refresh counter 127 may count the refresh command REF received from the RCD 110 over a predetermined period of time. The refresh counter 127 may compare the counted number with a threshold. In some example embodiments, the threshold may be the number of refreshes that is normally performed for the predetermined period of time to retain the integrity of the stored data. That is, when the counted number is smaller than the threshold, the data stored in the DRAM device 120 may be lost. In this case, the refresh counter 127 may determine the lack of sufficient refresh condition and output the power failure signal PF. At this point, the DRAM device 120 may enter a power failure mode.

In some example embodiments, the RCD 110 may detect that the DRAM device 120 enters the power failure mode in response to the power failure signal PF. The RCD 110 may provide information on the power failure mode to the processor 101 through the alert signal Alert_n.

In some example embodiments, the DRAM device 120 entering the power failure mode may perform a refresh operation without control from an external device (e.g., without the processor 101 and the RCD 110). That is, the refresh controller 126 of the DRAM device 120 entering the power failure mode may generate a refresh address ADDR_REF without an external refresh command to perform a refresh operation.

As described above, the memory module 100 according to example embodiments of inventive concepts may count the number of refresh commands REF for a predetermined period of time, and compare the counted number with a threshold to detect a state of the lack of sufficient refresh.

When it is determined that the lack of sufficient refresh condition exists, the memory module 100 may enter the power failure mode. That is, unlike a case where a power failure state is detected by a conventional low-voltage detector LVD, the memory module 100 may detect a state of the lack of sufficient refresh caused by a refresh command count, even under normal power or non-low-voltage conditions. Thus, a more reliable memory module is provided.

Figure 4:
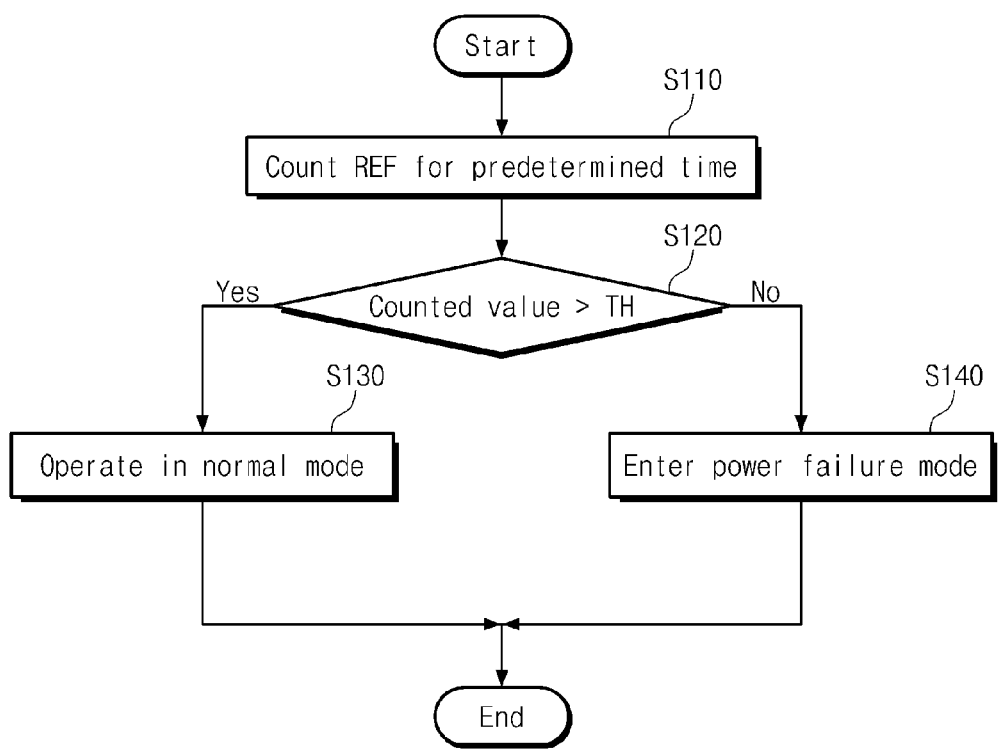
FIG. 4 is a flowchart summarizing operation of the DRAM device of FIG. 3.

FIG. 4 is a flowchart summarizing operation of the DRAM device 120 of FIG. 3. Referring to FIG. 4, at S110, the DRAM device 120 may count a refresh command REF over a predetermined period of time. In some example embodiments, the predetermined period of time may be a time predetermined based on a refresh cycle.

At S120, the DRAM device 120 may compare the counted number and a threshold TH. For example, the threshold TH may be the number of refresh operations that are normally performed for a predetermined period of time to retain the integrity of the data stored in the DRAM device 120. That is, under a normal operating mode, a refresh operation is performed more than the threshold TH for the predetermined period of time to ensure retention of the data stored in the DRAM device 120. In some embodiments, a refresh operation is performed the same as or more than the threshold TH in the normal operating mode.

When the counted number is greater than the threshold TH, the DRAM device 120 operates in a normal mode at operation S130. That is, the DRAM device 120 may perform a normal read or write operation under the control of the RCD 110 or the processor 101 without a separate operation.

Conversely, when the counted number is smaller than or equal to the threshold TH, the DRAM device 120 enters a power failure mode at operation S140. The case where the counted number is smaller than or equal to the threshold TH corresponds to the lack of sufficient refresh condition of the DRAM device 120. That is, the DRAM device 120 may enter the power failure mode at S140 to perform a refresh operation without control of an external device (e.g., without RCD 110 or the processor 101). In some example embodiments, the DRAM device 120 may perform a backup operation in the power failure mode.

Figure 5:
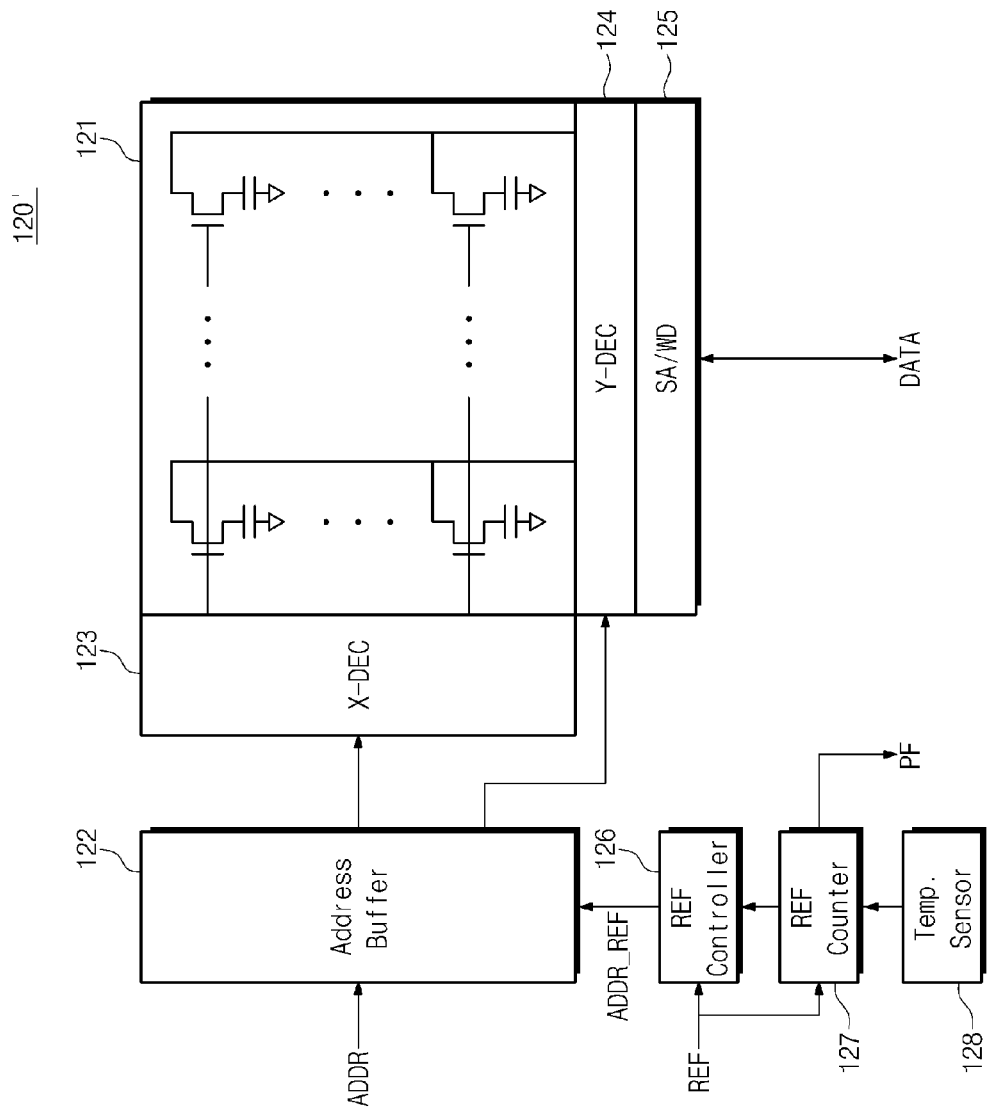
FIG. 5 is a block diagram of a DRAM device according to example embodiments of inventive concepts.

FIG. 5 is a block diagram of a DRAM device 120' according to example embodiments of inventive concepts. As illustrated, the DRAM device 120' includes a memory cell array 121, an address buffer 122, an X-decoder 123, a Y-decoder 124, a sense amplifier and write driver 125, a refresh controller 126, a refresh counter 127, and a temperature sensor 128. The memory cell array 121, the address buffer 122, the X-decoder 123, the Y-decoder 124, the sense amplifier and write driver 125, the refresh controller 126, and the refresh counter 127 have already been described above with reference to FIG. 3, and thus, a detailed description of these elements is not repeated.

Unlike the DRAM device 120 of FIG. 3, the DRAM device 120' of FIG. 5 further includes the temperature sensor 128. The temperature sensor 128 may provide information on temperature of the DRAM device 120' to the refresh counter 127. For example, the temperature sensor 128 may provide substantially the temperature of memory cells of the DRAM device 120'. The refresh counter 127 may adjust a threshold TH based on the information on temperature received from the temperature sensor 128.

For example, as the temperature of the DRAM device 120' increases, the number of refreshes required to retain data for a fixed period of time may increase. In this case, the refresh counter 127 may dynamically increase the threshold TH. Conversely, as the temperature of the DRAM device 120' decreases, the number of refreshes required to retain data for a fixed period of time may decrease. In this case, the refresh counter 127 may dynamically decrease the threshold TH. In other words, the refresh counter may increase the threshold in response to an increase in the temperature, or may decrease the threshold in response to a decrease in the temperature.

In some example embodiments, the information on temperature may be provided not only from the temperature sensor 128 in the DRAM device 120', but also from a separate temperature sensor disposed outside the DRAM device 120'. In other words, the temperature information can be provided by at least one of the temperature sensor 128 or a separate temperature sensor that is external relative to the DRAM device 120'.

According to the above-described embodiments, a threshold TH for entering a power failure mode may be varied depending on temperature variation of the DRAM device 120'. Thus, a DRAM device with improved reliability is provided. In addition, a memory module including the DRAM device having the improved reliability is provided.

Figure 6:
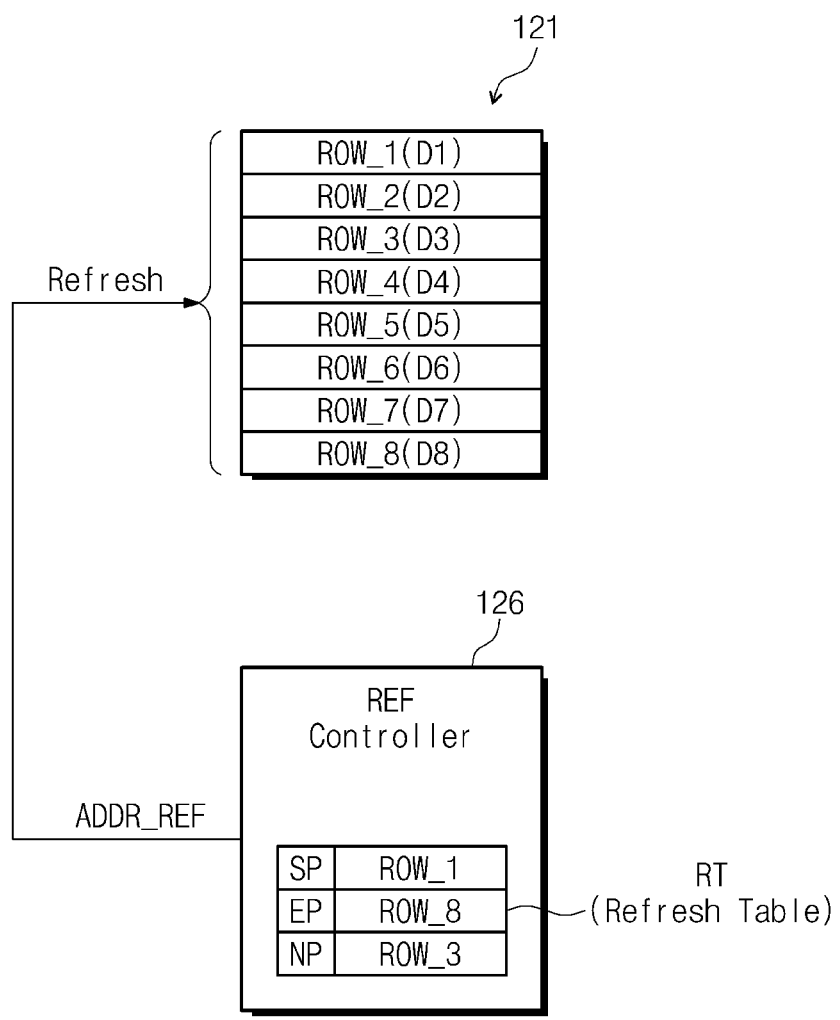
FIG. 6 is a conceptual diagram representing a refresh operation of a DRAM device in a power failure mode.

FIG. 6 is a conceptual diagram representing a refresh operation of a DRAM device in a power failure mode. As shown, a memory cell array 121 includes first to eighth rows ROW_1 to ROW_8. However, example embodiments of inventive concepts are not limited to this configuration. The memory cell array 121 may further any suitable number of rows and a plurality of banks each including a plurality of rows.

Referring to FIGS. 3 and 6, the memory cell array 121 may include the first row to the eighth rows ROW_1 to ROW_8 to respectively store first data to eighth data D1 to D8. In the power failure mode, the refresh controller 126 may generate a refresh address ADDR_REF for a refresh operation. For example, in the power failure mode, the refresh controller 126 may sequentially or non-sequentially output refresh addresses ADDR_REF corresponding to the first row to the eighth row ROW_1 to ROW_8 to perform a refresh operation on the first row to the eighth row ROW_1 to ROW_8 to store the first data to the eighth data D1 to D8, respectively.

The refresh operation may be performed on the first row to the eighth row ROW_1 to ROW_8 based on the refresh addresses ADDR_REF from the refresh controller 126. In some example embodiments, the refresh controller 126 may include a refresh table RT. The refresh table RT may include information on a start point SP, an end point EP, and a next point NP. The start point SP may indicate a start address of a refresh-required area, and the end point EP may indicate an end address of the refresh-required area. The next point NP may indicate an address of an area in which the next refresh operation is to be performed.

For example, the refresh-required area may be the first row to the eighth row ROW_1 to ROW_8 and the area in which the next refresh is to be performed may be the third row ROW_3, as shown in FIG. 6. In this case, the refresh table RT may be set such that the start point SP corresponds to the first row ROW_1, the end point EP corresponds to the eighth row ROW_8, and the next point NP corresponds to the third row ROW_3. During the next refresh operation, the refresh controller 126 may output the refresh addresses ADDR_REF to perform a refresh operation on the third row ROW_3. The refresh table RT is described in further detail below.

Figure 7:
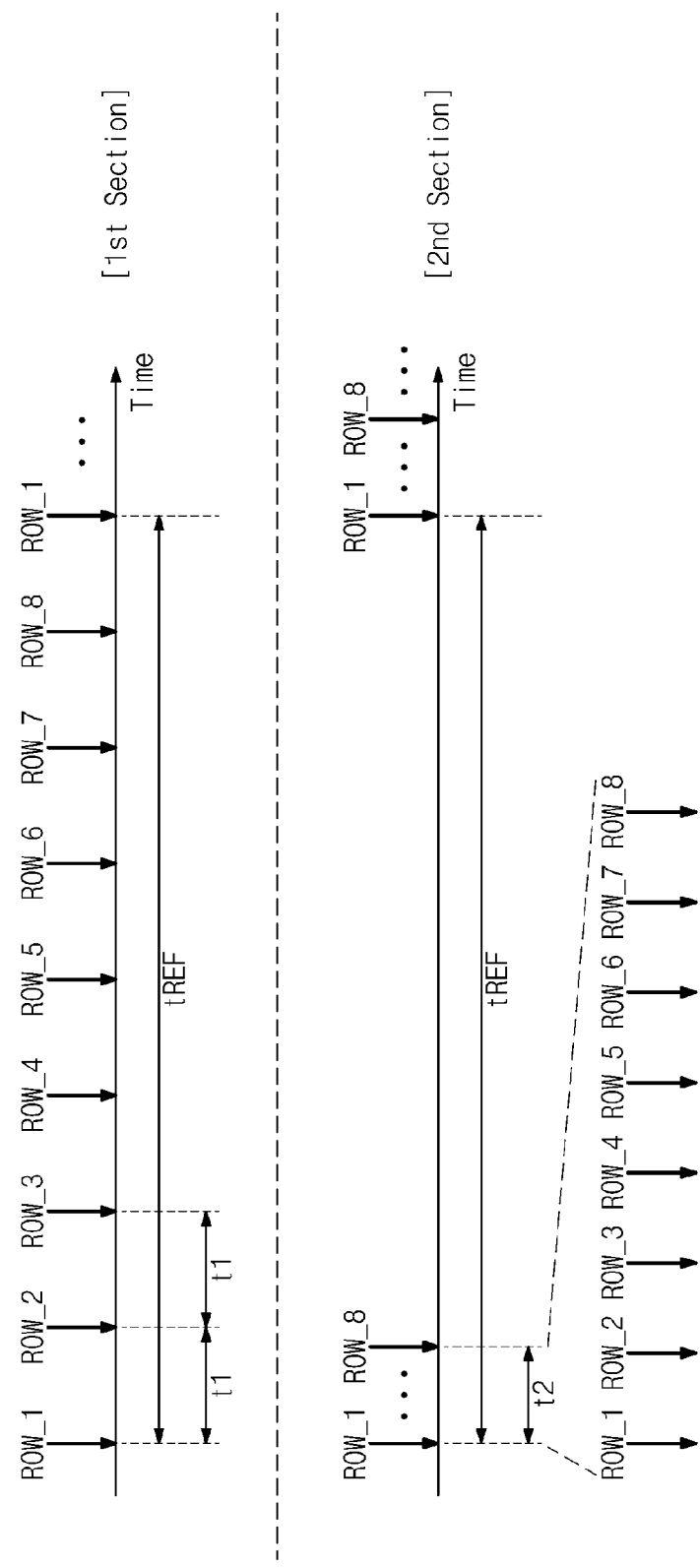
FIG. 7 is a timing diagram of a refresh operation of a refresh controller of FIG. 6.

FIG. 7 is a timing diagram of a refresh operation of the refresh controller 126 of FIG. 6. For brevity of description, it will be assumed that the refresh controller 126 performs a refresh operation on the first row to the eighth row ROW_1 to ROW_8, as described above.

Referring to FIGS. 6 and 7, the refresh controller 126 may perform a refresh operation on the first row to the eighth row ROW_1 to ROW_8 for a refresh cycle tREF. Alternatively, the refresh controller 126 may output the refresh address ADDR_REF to perform the refresh operation on each of the first row to the eighth row ROW_1 to ROW_8 for the refresh cycle tREF.

The refresh controller 126 may output the refresh address ADDR_REF in various manners. For example, the refresh controller 126 may periodically output an address of the first row to the eighth row ROW_1 to ROW_8 as the refresh address ADDR_REF, as shown in the first section of FIG. 7. In a more detailed example, the refresh controller 126 may output an address of the first row ROW_1 as the refresh address ADDR_REF to perform a refresh operation on the first row ROW_1. After first time t1 passes, the refresh controller 126 may output an address of the second row ROW_2 as the refresh address ADDR_REF. After the first time t1 passes again, the refresh controller 126 may output an address of the third row ROW_3 as the refresh address ADDR_REF. In other words, the refresh controller 126 may periodically output addresses of the first row to the eighth row ROW_1 to ROW_8 as the refresh address ADDR_REF throughout all intervals of the refresh cycle tREF.

In another example, the refresh controller 126 may output the addresses of the first row to the eighth row ROW_1 to ROW_8 as the refresh address ADDR_REF for fixed time, as shown in the second section of FIG. 7. In a more detailed example, the refresh controller 126 may output the addresses of the first row to the eighth row ROW_1 to ROW_8 as the refresh address ADDR_REF for second time t2. The second time t2 is shorter than the refresh cycle tREF. That is, the refresh controller 126 may output the addresses of the first row to the eighth row ROW_1 to ROW_8 as the refresh address ADDR_REF in a series of relatively shorter time intervals to perform a burst refresh operation on the first row to the eighth row ROW_1 to ROW_8.

In some example embodiments, the DRAM device 120 may perform a separate operation, such as a backup operation, until the next refresh operation is performed after the burst refresh operation is performed. In some example embodiments, the DRAM device 120 may perform the backup operation until the next refresh operation is performed after the burst refresh operation is performed (i.e., for time of tREF-t2). Examples of the backup operation are described in detail above, and further described below.

In the above-described embodiments, the operation of the refresh controller 126 has been described. However, example embodiments of inventive concepts are not limited thereto. For example, the refresh controller 126 may divide a refresh-required area into a plurality of sections and perform a burst refresh operation or a periodic refresh operation on each of the sections.

Figure 8:
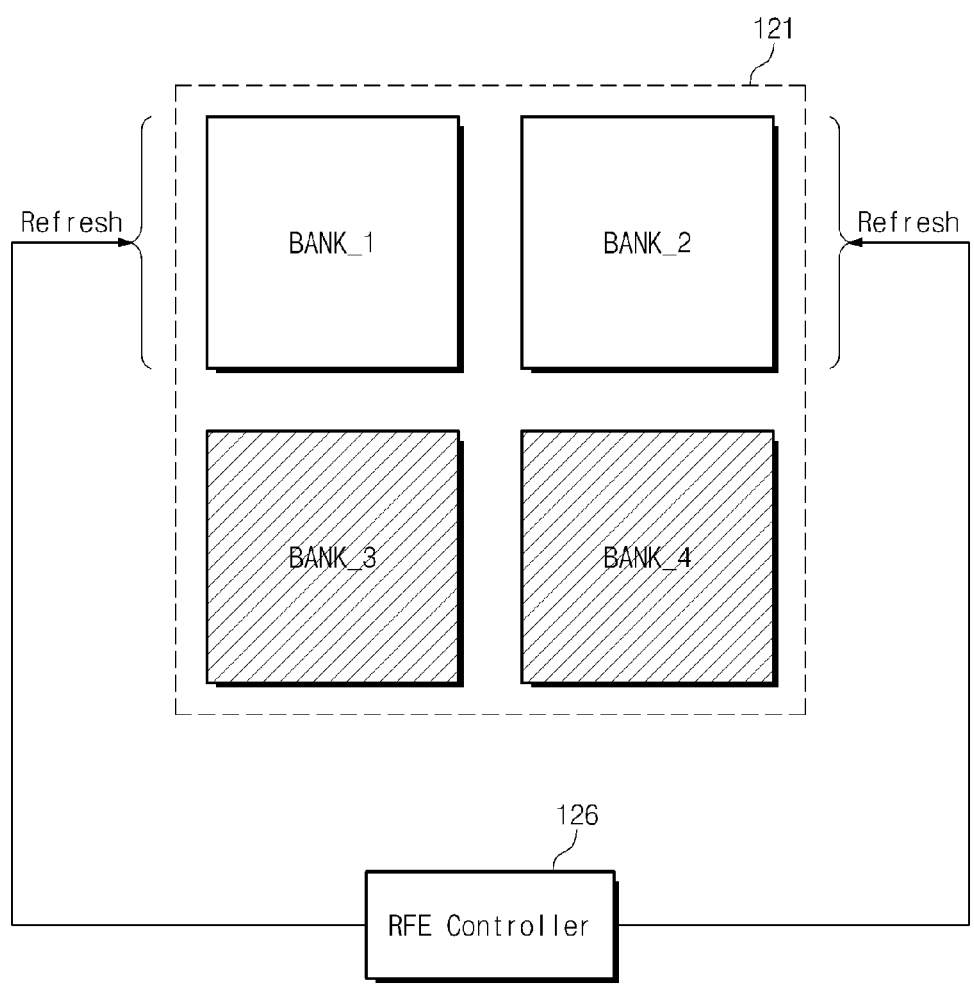
FIG. 8 is a conceptual diagram showing example embodiments of the refresh operation of the DRAM device in the power failure mode.

FIG. 8 is a conceptual diagram showing example embodiments of the refresh operation of the DRAM device in the power failure mode. Referring to FIG. 8, a memory cell array 121 may include first to fourth banks BANK_1 to BANK_4. In some example embodiments, the memory cell array 121 may further include a plurality of banks. Each of the first to fourth banks BANK_1 to BANK_4 may include a plurality of memory cells, respectively, and may be independently controlled under the control of the RCD 110 or the processor 101 (of FIGS. 1 and 2).

In a power failure mode, the refresh controller 126 may independently control a refresh operation on each of the first to fourth banks BANK_1 to BANK_4. The refresh controller 126 need not perform a refresh operation on some of the first to fourth banks BANK_1 to BANK_4. For example, the refresh controller 126 may generate a refresh address ADDR_REF to perform a refresh operation on the first and second banks BANK_1 and BANK_2. On the other hand, the refresh controller 126 may not generate a refresh address ADDR_REF for the third and fourth banks BANK_3 and BANK_4 such that a refresh operation is not performed on the third and fourth banks BANK_3 and BANK_4. In other words, the refresh controller 126 may selectively perform a refresh operation on some of a plurality of banks. In some example embodiments, banks in which a refresh operation is not performed may be banks in which data is not stored, banks in which backup is completed, banks in which importance of stored data is low, and/or banks in which data retention is not required due to security. Although not shown in the drawings, the refresh controller 126 may selectively control a refresh operation in units of banks, rows or memory cells.

According to the above-described embodiments, the DRAM device 120 may count a refresh command REF for predetermined time and compare the counted number with a threshold TH to enter a power failure mode. In the power failure mode, the DRAM device 120 may perform a refresh operation without control of an external device to retain data. Thus, a DRAM device with improved reliability is provided. In addition, a memory module including the DRAM device having the improved reliability is provided.

Figure 9:
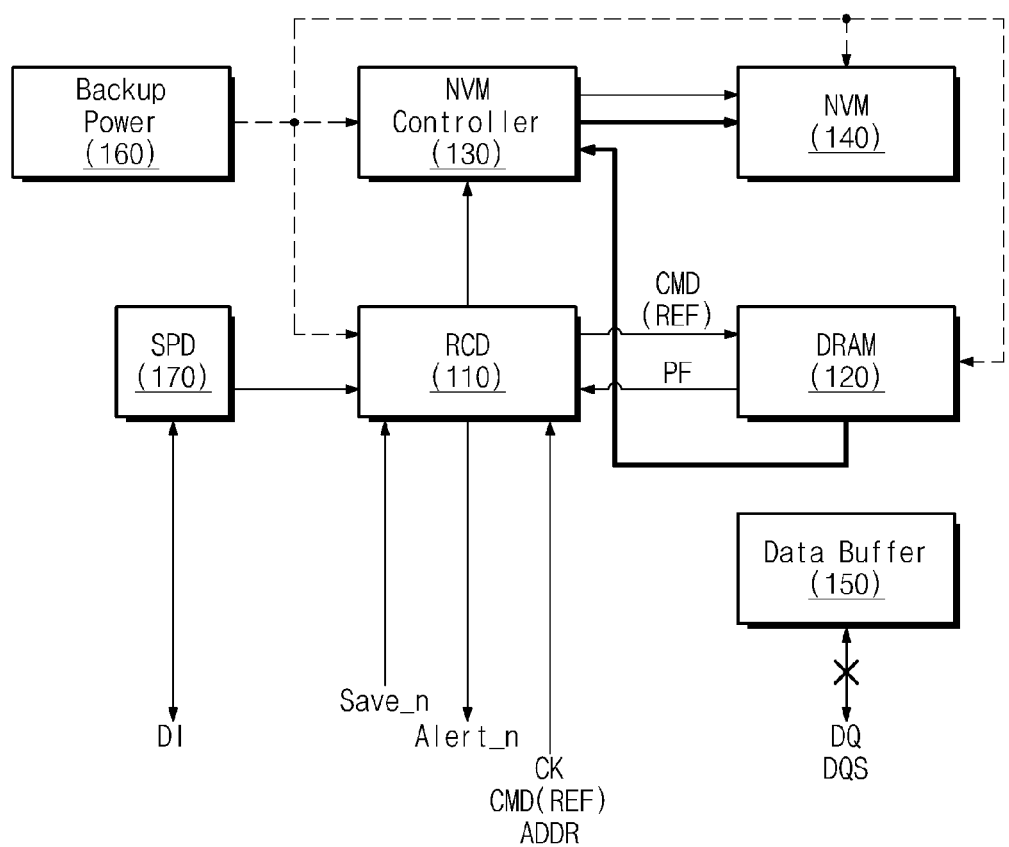
FIG. 9 is a block diagram illustrating a backup operation of the memory module of FIG. 1.

FIG. 9 is a block diagram illustrating a backup operation of the memory module 100 of FIG. 1. For brevity of description, detailed description of previously described or duplicate components is not repeated.

Referring to FIG. 9, the memory module 100 includes an RCD 110, a DRAM device 120, an NVM controller 130, a nonvolatile memory device 140, a backup power unit 160, a data buffer 150, and an SPD 170. The RCD 110, the DRAM device 120, the NVM controller 130, the nonvolatile memory device 140, the backup power unit 160, the data buffer 150, and the SPD 170 have already been described with reference to FIG. 2, and thus, a detailed description of these elements is not repeated.

As described above, the DRAM device 120 may count a refresh command REF for a predetermined period of time, and compare the counted number with a threshold TH to enter a power failure mode. When entering the power failure mode, the DRAM device 120 may provide a power failure signal PF to the RCD 110. The RCD 110 may alert, by an alert signal Alert_n, the processor 101 (of FIG. 1) when the DRAM device 120 enters the power failure mode.

The processor 101 (of FIG. 1) may recognize a power failure state based on the alert signal Alert_n, and perform a backup operation on the memory module 100. In some example embodiments, the processor 101 may provide a command CMD for backup to the memory module 100 to perform the backup operation of the memory module 100. Alternatively, the processor 101 may provide a separate signal (e.g., a save signal Save_n) to the memory module 100, and the memory module 100 may perform the backup operation in response to the separate signal without further control of the processor 101. Alternatively, the memory module 100 may perform a backup operation in response to a power failure signal PF without control of the processor 101.

For brevity of description, it will be assumed that a backup operation is performed without control of the processor 101. However, example embodiments of inventive concepts are not limited to the assumption.

As shown in FIG. 9, a backup operation may be performed in the power failure mode. The backup operation refers to an operation of copying or migrating data stored in the DRAM device 120 to the nonvolatile memory device 140. For example, the data stored in the DRAM device 120 is provided to the NVM controller 130 under the control of the RCD 110. The NVM controller 130 may program the received data into the nonvolatile memory device 140. In some example embodiments, the RCD 110, the DRAM device 120, the NVM controller 130, and the nonvolatile memory device 140 may be supplied with auxiliary power from the backup power unit 160 during a backup operation.

In FIG. 9, a data path during a backup operation is indicated by a bold line. As shown in FIG. 9, the data path to the processor 101 may be blocked. That is, a write or read operation of the processor 101 through a data signal DQ and a data strobe signal DQS may be blocked.

According to the above-described embodiments, the DRAM device 120 may enter a power failure mode based on a counted number of the refresh command REF. In the power failure mode, the memory module 100 may back up data of the DRAM device 120 to the nonvolatile memory device 140 to improve reliability of the data.

Figure 10:
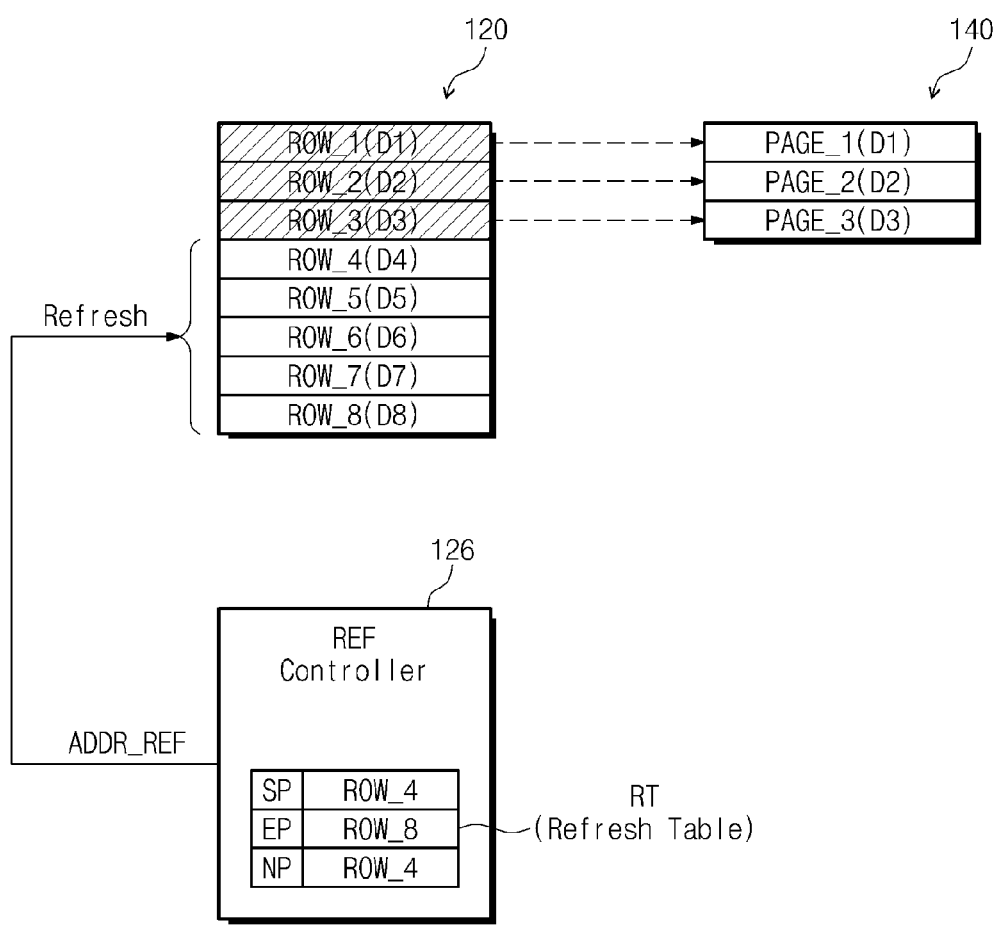
FIGS. 10, 11A, and 11B are conceptual diagrams representing a refresh operation of a DRAM device of FIG. 9 during a backup operation.
Figure 11A:
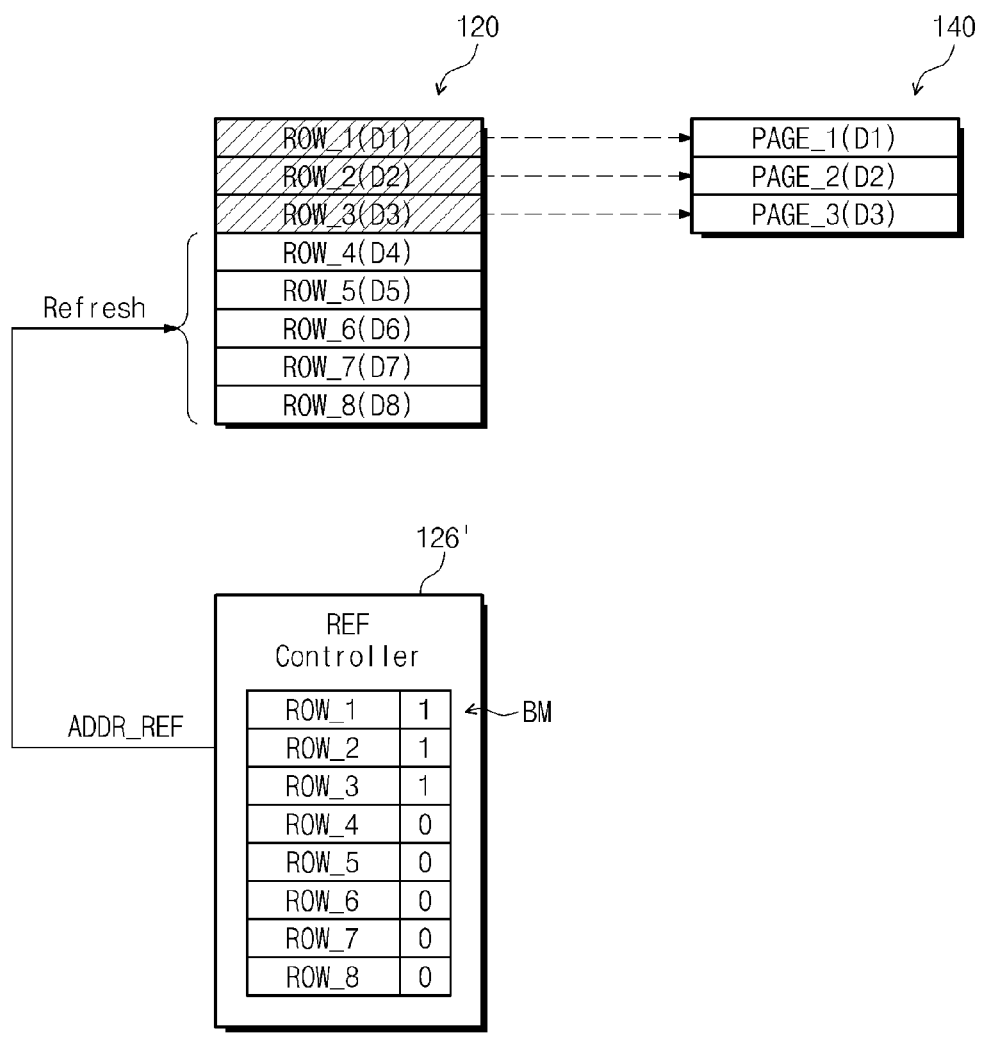
Figure 11B:
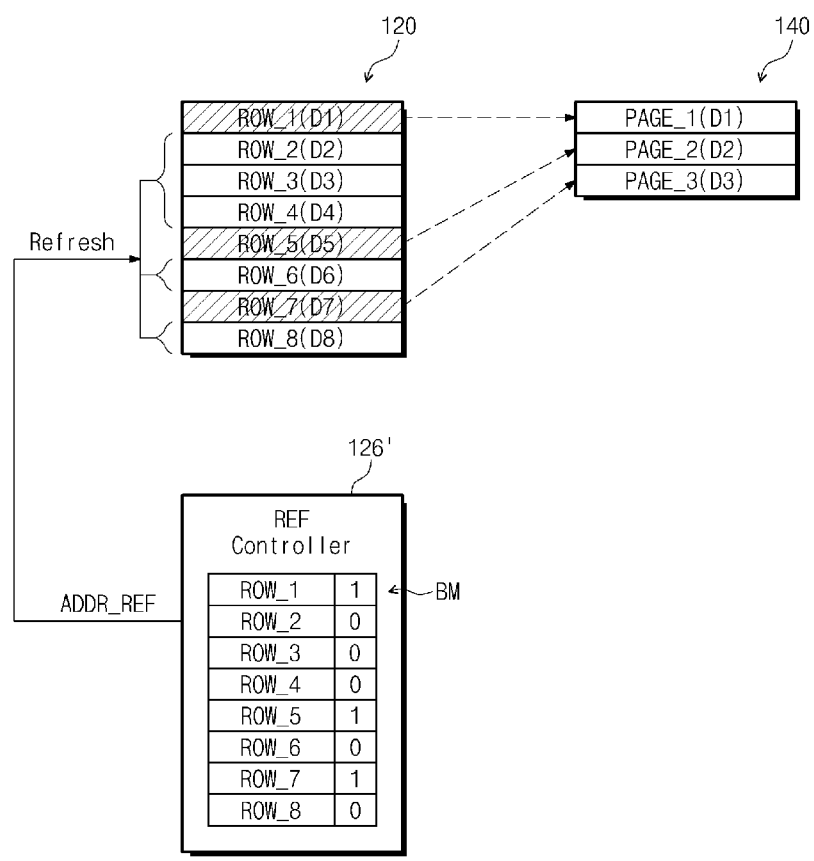

FIGS. 10, 11A, and 11B are conceptual diagrams representing a refresh operation of the DRAM device 120 of FIG. 9 during a backup operation. It will be assumed that a backup operation is performed in row units of the DRAM device 120 or page units of the nonvolatile memory device 140. In addition, it will be assumed that a refresh operation of the DRAM device 120 is performed in units of rows. However, example embodiments of inventive concepts are not limited to these assumptions. For example, the row units of the DRAM device 120 and the pages units of the nonvolatile memory device 140 may be different from each other, and the refresh operation of the DRAM device 120 may be performed in memory cell units, row units or bank units.

Referring to FIGS. 9 and 10, first to eighth rows ROW_1 to ROW_8 of the DRAM device 120 may store first data to eighth data D1 to D8, respectively. In some example embodiments, the DRAM device 120 may enter a power failure mode to perform a backup operation on the first to eighth rows ROW_1 to ROW_8. For example, the first data to the third data D1 to D3 of the first to third rows ROW_1 to ROW_3 may be backed up to first to third pages PAGE_1 to PAGE_3, respectively, of a nonvolatile memory device 140.

In this case, the refresh controller 126 may omit a refresh operation on backup-completed areas (i.e., the first to third rows ROW_1 to ROW_3). For example, the refresh controller 126 includes a refresh table RT, as described with reference to FIG. 6. The refresh table RT includes information on a start point SP, an end point EP, and a next point NP. The refresh controller 126 may set the start point SP to the fourth row ROW_4 and set the end point EP to the eighth row ROW_8 to omit a refresh operation on the first to third rows ROW_1 to ROW_3. In other words, the refresh controller 126 may adjust at least one of the start point or the end point of the refresh table RT such that the refresh-required area is reduced in proportion to the backed up data stored in the nonvolatile memory 140.

Referring to FIGS. 9 and 11, similar to the description with reference to FIG. 10, the first data to the third data D1 to D3 stored in the first to third rows ROW_1 to ROW_3 of the DRAM device 120 may be backed up to the first to third pages PAGE_1 to PAGE_3, respectively, of the nonvolatile memory device 140. The refresh controller 126' may subsequently omit a refresh operation on the first to third rows ROW_1 to ROW_3.

For example, the refresh controller 126' of FIGS. 11A and 11B may include a backup bitmap BM, unlike the refresh controller 126 of FIG. 10. The backup bitmap BM may include information on whether each of a plurality of rows of the DRAM device 120 is backed up. In more detailed example embodiments, the backup bitmap BM may include backup information on each of the first to eighth rows ROW_1 to ROW_8, as shown in FIGS. 11A and 11B. Values corresponding to backup-completed first to third rows ROW_1 to ROW_3 may be set to data '1', and values corresponding to backup-uncompleted fourth to eighth rows ROW_4 to ROW_8 may be set to data '0'. It will be understood that the '1' and '0' designators can be switched, or other suitable values used to indicate backup-completed and backup-uncompleted status. The refresh controller 126' may omit a refresh operation on the backup-completed areas (i.e., the first to third rows ROW_1 to ROW_3) with reference to the backup bitmap BM.

In some example embodiments, when a value corresponding to a specific row is set to data '1' in the backup bitmap BM, it may mean that backup of the specific row to the nonvolatile memory device 140 is completed. When the value corresponding to the specific row is set to data '0' in the backup bitmap BM, it may mean that the specific row is not yet backed up. However, these are merely exemplary and the configuration of the backup bitmap BM may be variously changed.

In the above example embodiments, the backup bitmap BM includes backup information of a row unit but example embodiments of inventive concepts are not limited thereto. The backup bitmap BM may include backup on a memory cell unit, a row unit, a sub-row unit, a column unit, a sub-column unit, a bank unit, or a sub-bank unit.

In other words, the refresh controller 126' includes the backup bitmap BM having information on a plurality of backup-completed rows of the memory cells of the memory cell array 121, and on a plurality of backup-uncompleted rows of the memory cells of the memory cell array 121. The refresh controller 126' may omit a refresh operation on the backup-completed rows of the memory cells.

As shown in FIG. 11B, the backed up rows need not be contiguous. For example, values corresponding to backup-completed rows ROW_1, ROWS, and ROW_7 may be set to data '1', and values corresponding to backup-uncompleted rows ROW_2 to ROW_4, ROW_6, and ROW_8, may be set to data '0'. The refresh controller 126' may omit a refresh operation on the backup-completed areas (i.e., the rows ROW_1, ROWS, and ROW_7) with reference to the backup bitmap BM.

As described above, a DRAM device according to example embodiments of inventive concepts may omit a refresh operation on a backup-completed area in a power failure mode. Thus, a DRAM device with improved reliability is provided. In addition, a memory module including the DRAM device having the improved reliability is provided.

Figure 12:
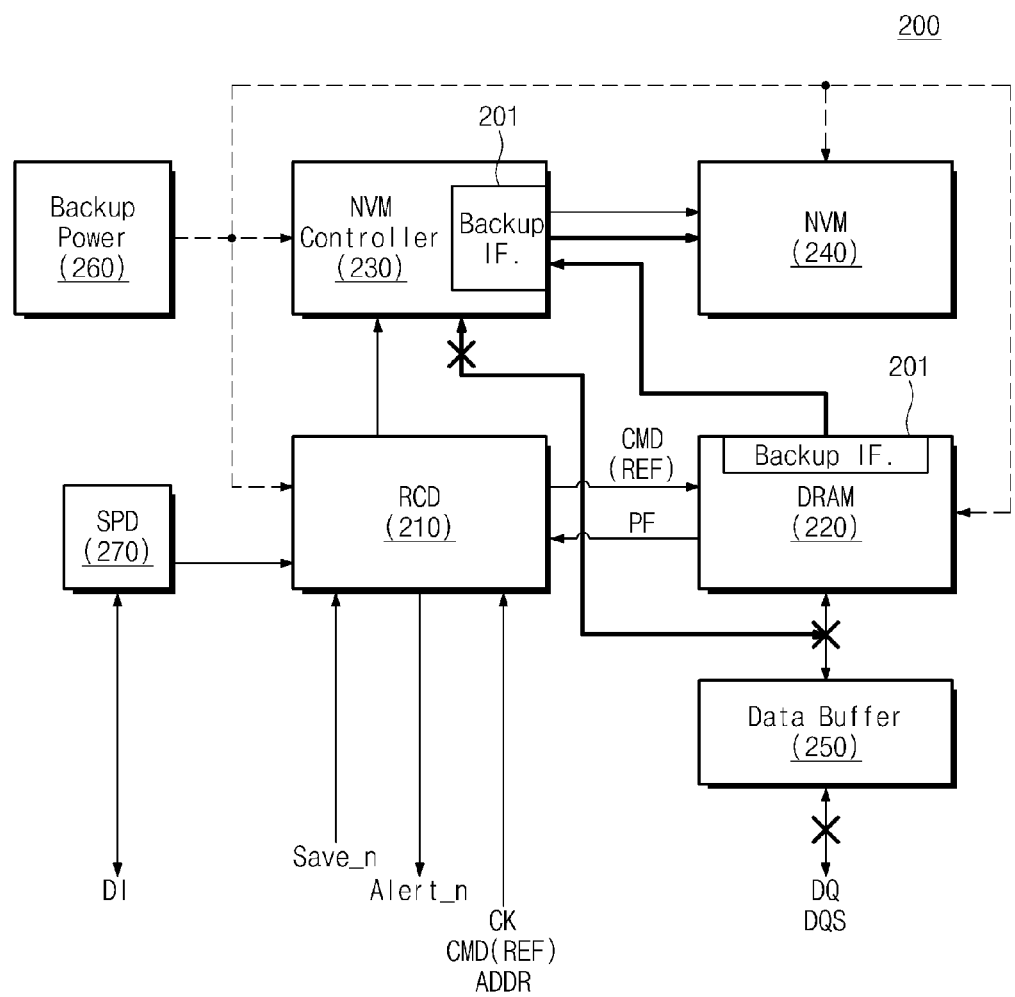
FIG. 12 is a block diagram of a memory module according to example embodiments of inventive concepts.

FIG. 12 is a drawing of a memory module 200 according to example embodiments of inventive concepts. Referring to FIG. 12, the memory module 200 includes an RCD 210, a DRAM device 220, an NVM controller 230, a nonvolatile memory device 240, a data buffer 250, a backup power 260, and an SPD 270. The RCD 210, the DRAM device 220, the NVM controller 230, the nonvolatile memory device 240, the data buffer 250, the backup power 260, and the SPD 270 have already been described with reference to FIG. 2, and thus, a detailed description of these elements is not repeated.

The DRAM device 220 and the NVM controller 230 each include a backup interface 201. The backup interface 201 provides not only a data path during a normal operation but also a separate data path for a backup operation. For example, the DRAM device 220 and the NVM controller may exchange with the data buffer 250 through a data signal DQ pin and a data strobe signal DQS pin during a normal operation. However, the DRAM device 220 and the NVM controller 230 may exchange data with each other through a separate data path provided by the backup interface 201 during a backup operation. The data path of the data buffer 250 may be blocked during the backup operation. That is, a main interface between the processor 101 (of FIG. 1) and the DRM device 220 may be blocked during the backup operation. Thus, an alternate data path may be provided by the backup interface 201 during the backup operation.

In some example embodiments, the DRAM device 220 may count a refresh command REF to enter a power failure mode, as described with reference to FIGS. 1 to 11B. In the power failure mode, the DRAM device 220 may perform a refresh operation, as described with reference to FIGS. 1 to 11B.

According to the above-described embodiments, a DRAM device may count a refresh command for a predetermined period of time, and compare the counted number with a threshold to detect the lack of sufficient refresh condition. The DRAM device may enter a power failure mode according to a comparison result. In the power failure mode, the DRAM device may perform a refresh operation without control of an external device. Alternatively or in addition, in the power failure mode, data stored in the DRAM device may be backed up to a nonvolatile memory device. Alternatively or in addition, in the power failure mode, the DRAM device may selectively perform a refresh operation. Thus, a DRAM device with improved reliability is provided. In addition, a memory module including the DRAM device having the improved reliability is provided.

Figure 13:
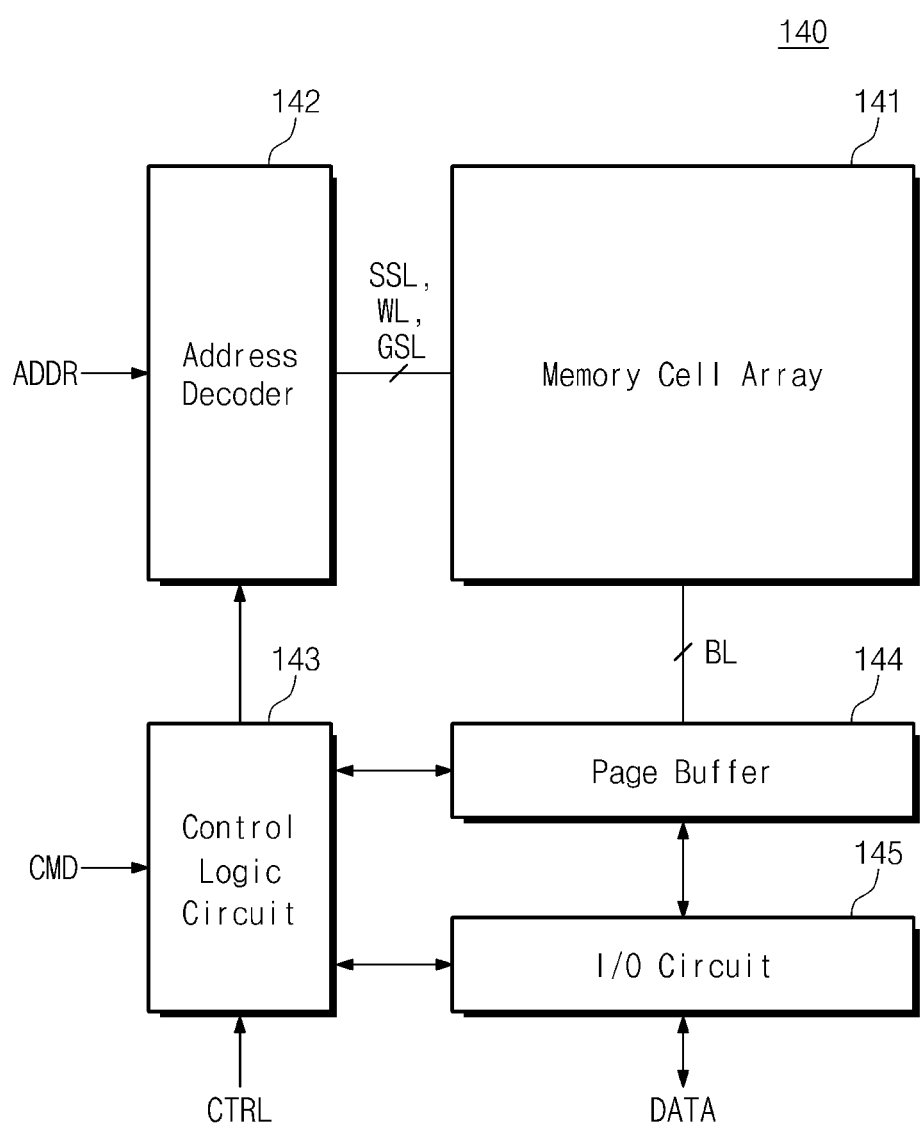
FIGS. 13 and 14 show additional details of the nonvolatile memory device of FIG. 2.
Figure 14:
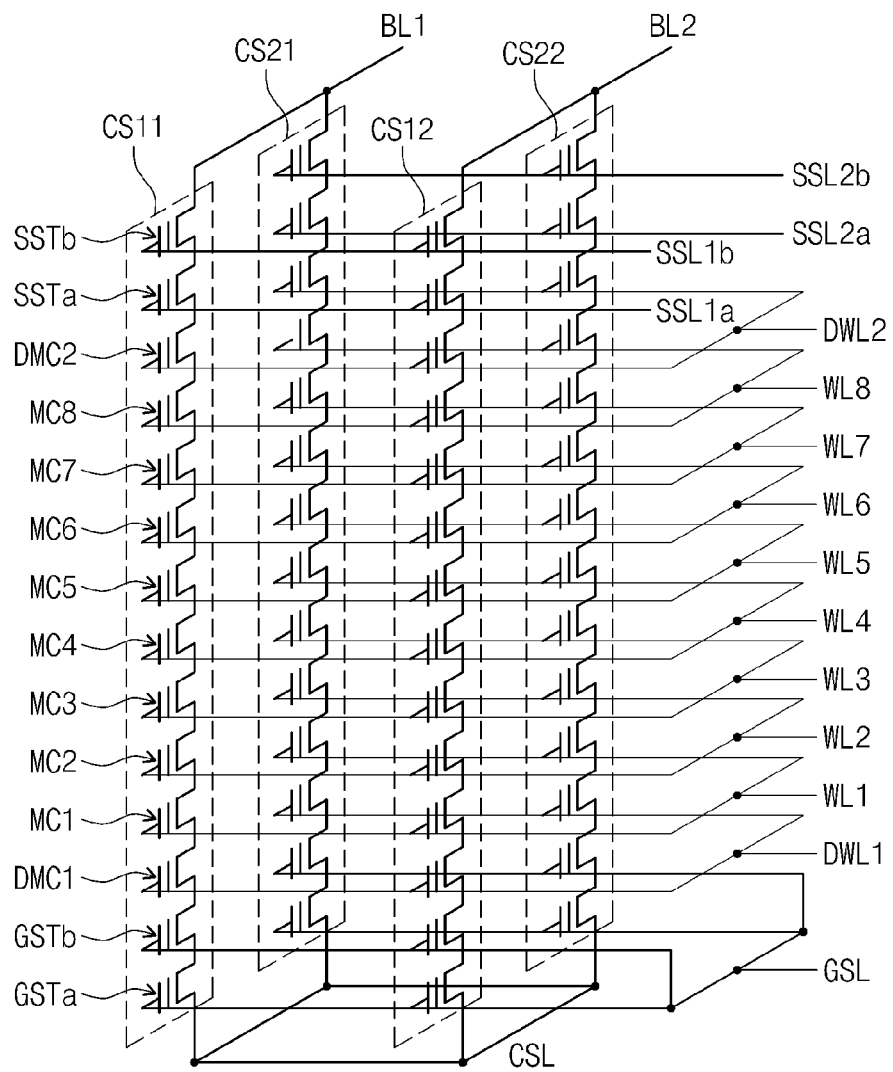
Figure 14:
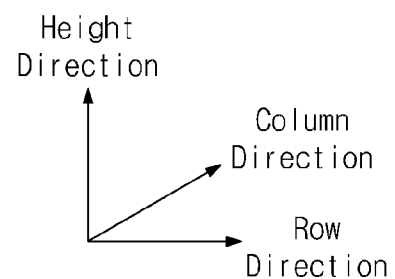

FIGS. 13 and 14 are drawings of the nonvolatile memory device 140 of FIG. 2. The nonvolatile memory device 140 shown in FIGS. 13 and 14 is a NAND flash memory device and is an example for describing some example embodiments of inventive concepts. However, example embodiments of inventive concepts are not limited thereto and the nonvolatile memory device 140 may include at least one of various nonvolatile memory devices such as read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), or the like.

As illustrated in FIG. 13, the nonvolatile memory device 140 includes a memory cell array 141, an address decoder 142, a control logic circuit 143, a page buffer 144, and an input/output (I/O) circuit 145.

The memory cell array 141 includes a plurality of memory blocks. Each of the memory blocks includes a plurality of strings. Each of the strings includes a plurality of memory cells. The memory cells are connected to a plurality of wordlines WL, respectively. Each of the memory cells may be provided as a single-level cell (SLC) storing one bit of data or a multi-level cell (MLC) storing at least two bits of data.

The address decoder 142 is connected to the memory cell array 141 through a plurality of wordlines WL, string selection lines SSL, and ground selection lines GSL. The address decoder 142 receives an address ADDR from the NVM controller 130. The address decoder 142 may decode the received address ADDR and control a plurality of wordlines WL based on the decoded address ADDR. For example, the address decoder 142 may select at least one of the wordlines WL based on the decoded address ADDR and control a voltage of the selected at least one wordline.

The control logic circuit 143 may receive a command CMD and a control signal CTRL from the NVM controller 130 and control the address decoder 142, the page buffer 144, and the I/O circuit 145 in response to the received signals. For example, the control logic circuit 144 may control the address decoder 142, the page buffer 144, and the I/O circuit 145 to write data DATA received from the IVM controller 130 into the memory cell array 141, or read data DATA stored in the memory cell array 141.

The page buffer 144 is connected to the memory cell array 141 through a plurality of bitlines BL. The page buffer 144 may temporarily store data DATA provided from the I/O circuit 145. The data DATA stored in the page buffer 144 may be stored in the memory cell array 141 under the control of the control logic circuit 143. The page buffer 144 may temporarily store the data DATA read from the memory cell array 141. The page buffer 144 may provide the read data DATA to the I/O circuit 145 under the control of the control logic circuit 143.

The I/O circuit 145 may receive data DATA from the NVM controller 130. The I/O circuit 145 may provide the received data DATA to the page buffer 124. The I/O circuit 145 may provide the data DATA provided from the control buffer 144 to the NVM controller 130 under the control of the control logic circuit 143.

In some example embodiments, a first memory block BLK1 of a three-dimensional structure is described below with reference to FIG. 14. However, example embodiments of the inventive concepts are not limited thereto and other memory blocks may have a similar structure to the first memory block BLK1.

As illustrated in FIG. 14, the first memory block BLK1 includes a plurality of cell strings CS11, CS12, CS21, and CS22. The cell strings CS11, CS12, CS21, and CS22 may be arranged in a row direction and a column direction to form rows and columns.

Each of the cell strings CS11, CS12, CS21, and CS22 includes a plurality of cell transistors. Each of the cell strings CS11, CS12, CS21, and CS22 includes a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In some example embodiments, each of a plurality of cell transistors included in the cell strings CS11, CS12, CS21, and CS22 may be a charge trap flash (CTF) memory cell.

The memory cells MC1 to MC8 are connected in series and are stacked in a height direction perpendicular to a substrate formed by a row direction and a column direction. The string selection transistors SSTa and SSTb are connected in series. The serially connected string selection transistors SSTa and SSTb are provided between the memory cells MC1 to MC8 and a bitline BL. The ground selection transistors GSTa and GSTb are connected in series. The serially connected ground selection transistors GSTa and GSTb are provided between the memory cells MC1 to MC8 and a common source line CSL.

In some example embodiments, a first dummy memory cell DMC1 may be provided between the memory cells MC1 to MC8 and the ground selection transistors GSTa and GSTb. According to at least some example embodiments of the inventive concepts, a second dummy memory cell MC2 may be provided between the memory cells MC1 to MC8 and the string selection transistors SSTa and SSTb. The ground selection transistors GSTa and GSTb of the cell strings CS11, CS12, CS21, and CS22 may be commonly connected to a ground selection line GSL.

In some example embodiments, ground selection transistors of the same row may be connected to the same ground selection line, and ground selection transistors of a different row may be connected to a different selection line. For example, the first ground selection transistor GSTa of the cell strings CS11 and CS12 of a first row may be connected to a first ground selection line, and the first ground selection transistor GSTa of the cell strings CS21 and CS22 of a second row may be connected to a second ground selection line.

Memory cells of the same height from a substrate (or the ground selection transistors GSTa and GSTb) are commonly connected to the same wordline, and memory cells of different heights from the substrate (or the ground selection transistors GSTa and GSTb) are connected to different wordlines. For example, first to eighth memory cells MC1 to MC8 of the cells strings CS11, CS12, CS21, and CS22 are commonly connected to first to eighth wordlines WL1 to WL8, respectively.

Among the first string selection transistors SSTa of the same height, string selection transistors of the same row are connected to the same string selection line and string selection transistors of different rows are connected to different string selection lines. For example, the first string selection transistors SSTa of the cell strings CS11 and CS12 of the first row are commonly connected to a string selection line SSL1*a* and the first string selection transistors SSTa of the cell strings CS21 and CS22 of the second row are commonly connected to the string selection line SSL1*a*.

Similarly, among the second selection transistors SSTb of the same height, string selection transistors of the same height are connected to the same string selection line, and string selection transistors of different rows are connected to different string selection lines. For example, the string selection transistors SSTb of the cell strings CS11 and CS12 of the first row are commonly connected to a string selection line SSL1*b*, and the string selection transistors SSTb of the cell strings CS21 and CS22 of the second row are commonly connected to the string selection line SSL2*b*.

In some example embodiments, dummy memory cells of the same height are connected to the same dummy wordline, and dummy memory cells of different heights are connected to different dummy wordlines. For example, the first dummy memory cells DMC1 are connected to a first dummy wordline DWL1, and second dummy memory cells DMC2 are connected to a second dummy wordline DWL2.

In the first memory block BLK1, read and write operations may be performed in units of rows. For example, a single row of a memory block BLKa may be selected by the string selection lines SSL1*a*, SSL1*b*, SSL2*a*, and SSL2*b*. In the first memory block BLK1, an erase operation may be performed in units of memory blocks or sub-blocks. When an erase operation is performed in units of memory blocks, all memory cells MC of the first memory block BLK1 may be simultaneously erased according to a single erase request. When an erase operation is performed in units of sub-blocks, some of memory cells MC of the first memory block BLK1 may be simultaneously erased according to a single erase request, and the other memory cells may be erase-inhibited. A wordline connected to the erased memory cells may be supplied with a low voltage (e.g., ground voltage), and a wordline connected to the erase-inhibited memory cells may be floated.

In some example embodiments, the first memory block BLK1 shown in FIG. 14 is merely an example, the number of cell strings may increase or decrease, and the number of rows and columns constituted by cell strings may increase or decrease according to the number of the cell strings. Moreover, the number of cell transistors GSTS, MC, DMC, SST, and the like of the first memory block BLK1 may increase or decrease, and height of the first memory block BLK1 may increase or decrease according to the number of the cell transistors. The number of lines GSL, WL, DWL, SSL, and the like connected to the cell transistors may increase or decrease according to the number of the cell transistors.

Figure 15:
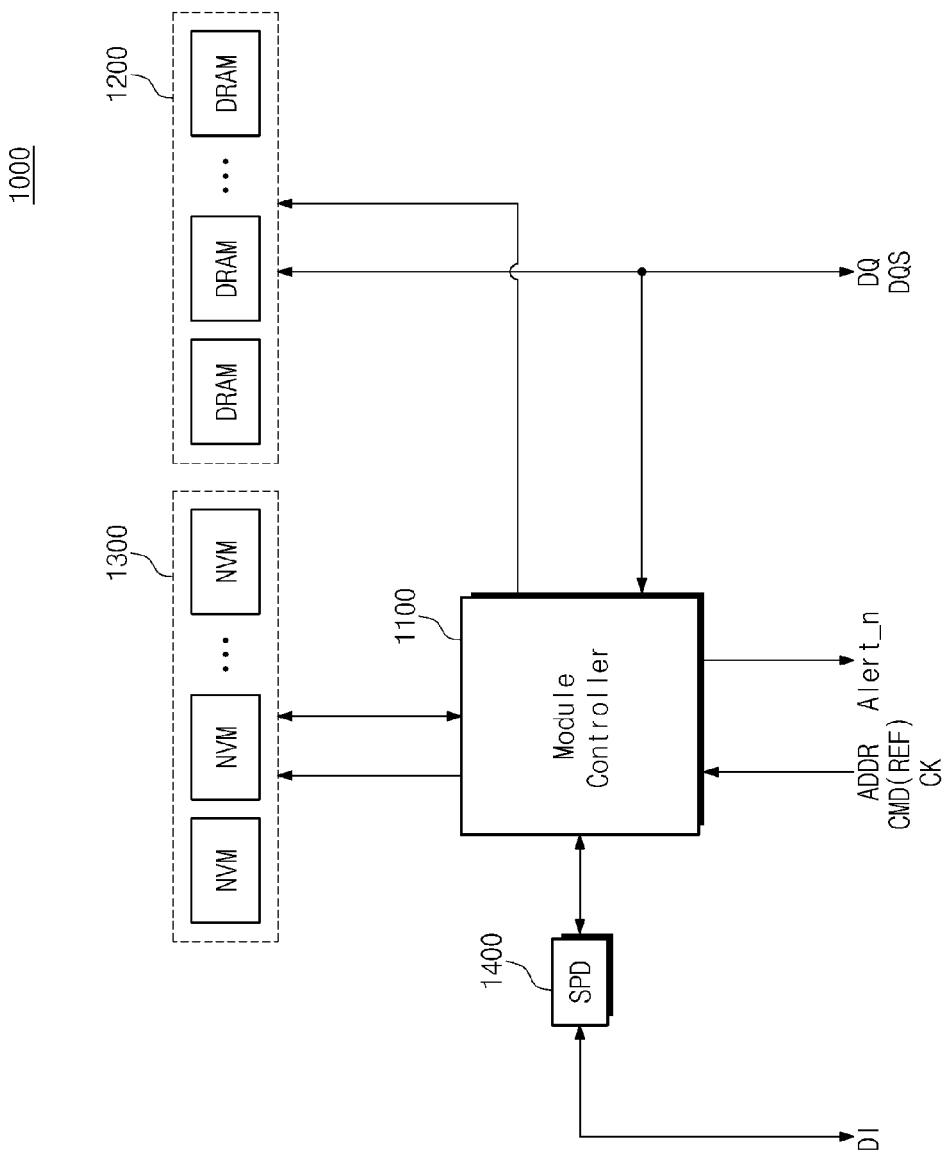
FIGS. 15 and 16 are block diagrams of memory modules according to example embodiments of inventive concepts.
Figure 16:
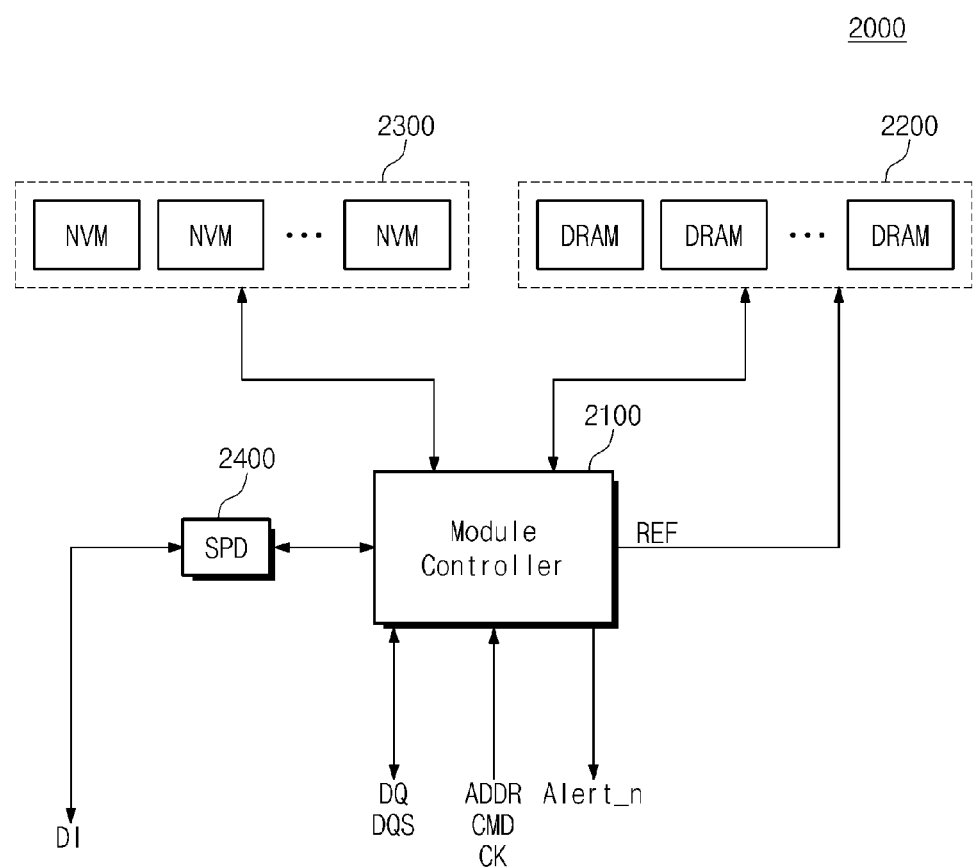

FIGS. 15 and 16 are block diagram of memory modules according to example embodiments of inventive concepts. Although memory modules are described below with reference to FIGS. 15 and 16, example embodiments of inventive concepts are not limited thereto and the memory modules may be variously modified without departing from example embodiments of inventive concepts.

As illustrated in FIG. 15, a memory module 1000 includes a module controller 1100, a DRAM 1200, nonvolatile memory devices 1300, and a serial presence detect chip (SDP) 1400. The module controller 1100 is configured to receive an address ADDR, a command CMD, and a clock CK from an external device (e.g., processor). The module controller 1100 is configured to control the DRAM 1200 or the nonvolatile memory device 1300 in response to received signals. In some example embodiments, the module controller 1100 may include an RCD and an NVM controller described with reference to FIGS. 1 to 14.

The DRAM 1200 is configured to store data received through a data signal DQ pin and a data strobe signal DQS pin or output stored data through the data signal DQ pin or the data strobe signal DQS pin from an external device (e.g., processor) under the control of the module controller 1100. In some example embodiments, the DRAM 1200 may perform a refresh operation under the control of the module controller 1100. The DRAM device 1200 may count a refresh command and enter a power failure mode based on the counted value, as described with reference to FIGS. 1 to 14.

In some example embodiments, in the power failure mode, the DRAM 1200 may transmit a power failure single to the module controller 1100 and the module controller 1100 may output an alert signal Alert_n in response to the power failure signal.

The nonvolatile memory device 1300 may store the data received from the module controller 1100 or transmit the data to the module controller 1100 under the control of the module controller 1100. In some example embodiments, data of the DRAM 1200 may be backed up to the nonvolatile memory device 1300 under the control of the module controller 1100 when the DRAM 1200 enters the power failure mode. Although not shown in the drawing, the nonvolatile memory device 1300 may directly transmit and receive data to and from an external device (e.g., processor) through the data signal DQ pin and/or the data strobe signal DQS pin. The SPD 1400 may include device information DI of the memory module 1000 and transmit the device information DI to an external device (e.g., processor) through a serial bus. In some example embodiments, the memory module 1000 may be in the form of a registered dual in-line memory module (DIMM), and be directly connected to an external device (e.g., processor) to communicate with the external device.

As illustrated in FIG. 16, a memory module 2000 includes a module controller 2100, a DRAM 2200, a nonvolatile memory device 2300, and an SPD 2400. The module controller 2100 receives a command CMD, an address ADDR, a clock CK, a data signal DQ, and a data strobe signal DQS from an external device (e.g., processor). The module controller 2100 may control the DRAM 2200 and the nonvolatile memory device 2300 in response to received signals.

In some example embodiments, DRAM 1200 and the nonvolatile memory device 1300 of the memory module 1000 of FIG. 15 are recognized by an external device (e.g., processor). However, the DRAM 2200 and the nonvolatile memory device 2300 of the memory module 2000 of FIG. 16 may not be recognized by an external device. In other words, the DRAM device 2200 and the nonvolatile memory device 2300 of the memory module 2000 may be recognized as a single address area and each address area may be managed by the module controller 2100.

In this case, the module controller 2100 may control a refresh operation of the DRAM 2200. As described with reference to FIGS. 1 to 14, the DRAM 2200 may count a refresh command REF to enter a power failure mode. In the power failure mode, the DRAM 2200 may perform the refresh operation without control of the module controller 2100. In the power failure mode, the module controller 2100 may back up data of the DRAM 2200 to the nonvolatile memory device 2300. The SPD 2400 may include device information DI of the memory module 2000, and transmit the device information DI to an external device through a serial bus.

Figure 17:
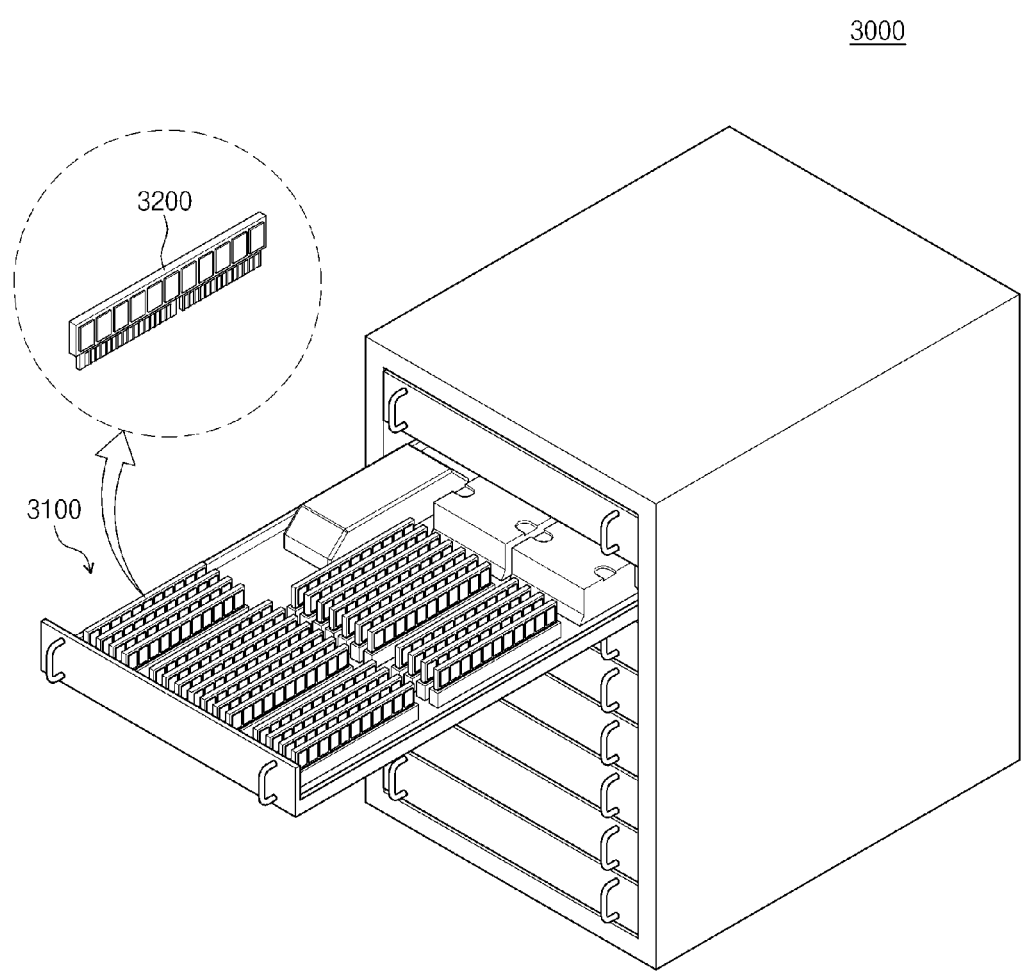
FIG. 17 is a perspective view of a server system including a memory module according to example embodiments of inventive concepts.

FIG. 17 illustrates a server system 3000 including a memory module according to example embodiments of inventive concepts. As illustrated, the server system 3000 may include a plurality of server racks 3100. Each of the server racks 3100 may include a plurality of memory modules 3200. The memory modules 3200 may be directly connected to processors included in the server racks 3100, respectively. For example, the memory modules 3200 may be in the form of a dual in-line memory module (DIMM) and be mounted on a DIMM socket electrically connected to a processor to communicate with the processor. In some example embodiments, the memory modules 3200 may be used as a storage, a main memory, a buffer memory, and a cache memory of the server system 3000. In some example embodiments, the memory modules 3200 may operate according to the method described with reference to FIGS. 1 to 14.

According the above-described embodiments, a DRAM device of a memory module may count a refresh count, and compare the counted number with a threshold to detect the lack of sufficient refresh condition. In case of the lack of sufficient refresh condition, the DRAM device may enter a power failure mode to perform a refresh operation without control of an external device. Moreover, when the DRAM device enters the power failure mode, the memory module may back up data of the DRAM device to a nonvolatile memory device. During the backup operation, the DRAM device may selectively perform the refresh operation. Thus, a DRAM device with improved reliability and reduced cost is provided. In addition, a memory module including the DRAM device having the improved reliability is provided. Moreover, an improved operating method of the DRAM device is provided.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A dynamic random access memory (DRAM) device comprising:
   a memory cell array including a plurality of memory cells;
   a refresh controller configured to perform a plurality of refresh operations on the plurality of memory cells in response to a plurality of refresh commands from an external device; and
   a refresh counter configured to count a number of the refresh commands for a fixed period of time and compare the counted number with a threshold,
   wherein the refresh counter is configured to generate a power failure signal to cause the DRAM device to enter a power failure mode in response to the comparison of which the counted number is smaller than the threshold, and wherein the refresh controller is configured to perform a refresh operation on the plurality of memory cells without control of the external device in the power failure mode.

2. The DRAM device as set forth in claim 1, wherein in response to the counted number being smaller than the threshold, the refresh counter is configured to determine a lack of sufficient refresh condition.

3. The DRAM device as set forth in claim 1, wherein, in the power failure mode, the refresh controller is configured to sequentially perform a refresh operation on the plurality of memory cells during a refresh cycle.

4. The DRAM device as set forth in claim 1, wherein, in the power failure mode, the refresh controller is configured to sequentially perform a refresh operation on the plurality of memory cells for a period of time that is shorter than a refresh cycle.

5. The DRAM device as set forth in claim 1, further comprising: a temperature sensor configured to detect temperature of the DRAM device, wherein the refresh counter is configured to adjust the threshold depending on the temperature.

6. The DRAM device as set forth in claim 5, wherein the refresh counter is configured to increase the threshold as the temperature increases, and decrease the threshold as the temperature decreases.

7. The DRAM device as set forth in claim 1, wherein, in the power failure mode, the refresh counter is configured to output the power failure signal to the external device.

8. The DRAM device as set forth in claim 1, further comprising a nonvolatile memory device, wherein, in the power failure mode, the nonvolatile memory device is configured to store backed up data from the plurality of memory cells under control of the external device.

9. The DRAM device as set forth in claim 1, wherein, in the power failure mode, the refresh controller is configured to selectively perform a refresh operation on the plurality of memory cells.

10. The DRAM device as set forth in claim 1, wherein the refresh controller is configured to omit a refresh operation on memory cells in which backup-completed data is stored among the plurality of memory cells.

11. The DRAM device as set forth in claim 1, wherein:
   the refresh controller includes a backup bitmap having information on a plurality of backup-completed rows of the memory cells and on a plurality of backup-uncompleted rows of the memory cells, and
   the refresh controller is configured to omit a refresh operation on the backup-completed rows of the memory cells.

12. A memory module comprising:
   a nonvolatile memory device;
   a dynamic random access memory (DRAM) device; and
   a control device configured to control the DRAM, wherein:
   the DRAM device is configured to count a number of refresh commands received from the control device, to compare the counted number with a threshold, and to output a power failure signal in response to the comparison of which the counted number is smaller than the threshold, and
   the control device is configured to control the DRAM device such that data stored in the DRAM device is backed up to the nonvolatile memory device in response to the power failure signal.

13. The memory module as set forth in claim 12, wherein the DRAM device comprises:
   a memory cells array including a plurality of memory cells;
   a refresh counter configured to count the number of the refresh commands, compare the counted number with the threshold, and output a power failure signal according to the comparison; and
   a refresh controller configured to perform a refresh operation, in response to the power failure signal, on the plurality of memory cells without control of the control device.

14. The memory module as set forth in claim 13, wherein the nonvolatile memory device is configured to store the backed up data from the plurality of memory cells, and wherein the refresh controller is configured to omit a refresh operation on memory cells in which the backed up data stored in the nonvolatile memory device is stored among the plurality of memory cells.

15. The memory module as set forth in claim 12, wherein:
   the DRAM device includes a main interface configured to exchange data with an external device, and a backup interface configured to communicate with the nonvolatile memory device, and
   the control device is configured to control the DRAM device such that the data is backed up to the nonvolatile memory device through the backup interface in response to the power failure signal.

16. A memory module comprising:
   a memory cell array including a plurality of memory cells;
   a nonvolatile memory;
   a refresh controller configured to perform a plurality of refresh operations on the plurality of memory cells in response to a plurality of refresh commands;
   a refresh counter configured to count a number of the refresh commands for a fixed period of time and compare the counted number with a threshold; and
   a nonvolatile memory controller configured to back up data stored in the plurality of memory cells to the nonvolatile memory in response to the comparison of which the counted number is smaller than the threshold.

17. The memory module of claim 16, wherein:
the refresh counter is configured to adjust the threshold depending on a temperature.

18. The memory module of claim 17, further comprising a temperature sensor, wherein:
the temperature sensor is configured to detect the temperature, wherein the temperature corresponds to substantially a temperature of the memory cell array, and
the nonvolatile memory controller is configured to back up the data stored in the plurality of memory cells to the nonvolatile memory in response to the counted number being less than the threshold.

19. The memory module of claim 16, wherein:
the refresh controller includes a refresh table having information on a start point indicating a start address of a refresh-required area, and an end point indicating an end address of the refresh-required area, and
the refresh controller is configured to adjust at least one of the start point or the end point such that the refresh-required area is reduced in proportion to the backed up data stored in the nonvolatile memory.

20. The memory module of claim 16, wherein:
the refresh controller includes a backup bitmap having information on a plurality of backup-completed rows of the memory cells and on a plurality of backup-uncompleted rows of the memory cells, and
the refresh controller is configured to omit a refresh operation on the backup-completed rows of the memory cells.

* * * * *